US009363936B2

(12) United States Patent
Kodama et al.

(10) Patent No.: US 9,363,936 B2
(45) Date of Patent: Jun. 7, 2016

(54) MANUFACTURE WORK MACHINE AND MANUFACTURE WORK SYSTEM

(75) Inventors: Seigo Kodama, Yatomi (JP); Noriaki Iwaki, Hekinan (JP); Kazuya Furukawa, Chiryu (JP); Kimihiko Yasuda, Nishio (JP); Kazuyoshi Nagato, Toyoake (JP); Takuya Tomita, Seto (JP); Masaki Kato, Toyota (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 251 days.

(21) Appl. No.: 13/641,637

(22) PCT Filed: Mar. 15, 2011

(86) PCT No.: PCT/JP2011/056060
§ 371 (c)(1),
(2), (4) Date: Oct. 16, 2012

(87) PCT Pub. No.: WO2011/135938
PCT Pub. Date: Nov. 3, 2011

(65) Prior Publication Data
US 2013/0041492 A1 Feb. 14, 2013

(30) Foreign Application Priority Data

Apr. 29, 2010 (JP) .................................. 2010-104661

(51) Int. Cl.
*H05K 13/08* (2006.01)
*H05K 1/18* (2006.01)

(52) U.S. Cl.
CPC ................ *H05K 13/08* (2013.01); *H05K 1/181* (2013.01); *H05K 2201/10106* (2013.01)

(58) Field of Classification Search
CPC ............ G05B 19/18; G06F 9/46; H05K 3/34; H05K 3/30; H05K 13/00; H05K 13/04; H05K 13/08; H05K 1/18; H05K 5/00; H01L 21/60; H04N 5/22; B23P 19/00; A47J 45/00
USPC .................. 700/9, 95, 56, 86, 87; 713/16, 20; 29/83, 74, 73, 59; 348/22; 361/68; 294/64
See application file for complete search history.

(56) References Cited

U.S. PATENT DOCUMENTS

| 4,790,069 | A | 12/1988 | Maruyama et al. |
| 5,960,534 | A | 10/1999 | Yazawa et al. |

(Continued)

FOREIGN PATENT DOCUMENTS

| CN | 1714611 A | 12/2005 |
| CN | 1799299 A | 7/2006 |

(Continued)

OTHER PUBLICATIONS

Office Action issued in Japanese Patent Application No. 2010-122483 dated Jan. 21, 2014 (with translation).

(Continued)

*Primary Examiner* — Mohammad Ali
*Assistant Examiner* — Md Azad
(74) *Attorney, Agent, or Firm* — Oliff PLC

(57) ABSTRACT

A manufacture work machine for performing a manufacture work including: a plurality of work-element performing apparatuses each including an individual control device; and a central control device configured to control the apparatuses and including a central communication section to transmit, according to one protocol, a motion command in a specific programming language, wherein the individual control device includes (a) an individual communication section configured to receive, according to the one protocol, the motion command transmitted from the central control device and (b) a command converting section configured to convert the motion command received by the individual communication section into a motion command in a programming language that the individual control device can handle, the individual control device being configured to control one of the plurality of work-element performing apparatuses that is controlled by the individual control device, on the basis of the motion command converted by the command converting section.

24 Claims, 13 Drawing Sheets

(56) References Cited

U.S. PATENT DOCUMENTS

| | | | |
|---|---|---|---|
| 6,161,277 A | 12/2000 | Asai et al. | |
| 6,708,385 B1 | 3/2004 | Lemelson | |
| 6,718,629 B1 | 4/2004 | Stanzl | |
| 6,876,896 B1 | 4/2005 | Ortiz et al. | |
| 6,948,232 B1 | 9/2005 | Yazawa et al. | |
| 2003/0093254 A1 | 5/2003 | Frankel et al. | |
| 2003/0135991 A1* | 7/2003 | Nagao et al. | 29/739 |
| 2004/0117983 A1 | 6/2004 | Beck et al. | |
| 2006/0017765 A1 | 1/2006 | Sato | |
| 2006/0085973 A1 | 4/2006 | Kodama et al. | |
| 2006/0131156 A1 | 6/2006 | Voelckers | |
| 2006/0179645 A1 | 8/2006 | Chikuma et al. | |
| 2006/0207090 A1 | 9/2006 | Kawada | |
| 2006/0224265 A1* | 10/2006 | Nakayama et al. | 700/108 |
| 2007/0089113 A1* | 4/2007 | Kobayashi | 718/103 |
| 2007/0296826 A1 | 12/2007 | Kimura | |
| 2008/0158596 A1 | 7/2008 | Kadota | |
| 2010/0131078 A1 | 5/2010 | Brown et al. | |
| 2010/0131081 A1* | 5/2010 | Brown et al. | 700/21 |
| 2011/0058107 A1 | 3/2011 | Sun et al. | |
| 2011/0156898 A1 | 6/2011 | Taillefer et al. | |

FOREIGN PATENT DOCUMENTS

| | | |
|---|---|---|
| CN | 1835676 A | 9/2006 |
| CN | 101094322 A | 12/2007 |
| DE | 4016033 A1 | 11/1991 |
| JP | S58-175894 A | 10/1983 |
| JP | A-61-39134 | 2/1986 |
| JP | H02-288393 A | 11/1990 |
| JP | A-3-167895 | 7/1991 |
| JP | A-4-172504 | 6/1992 |
| JP | A-5-46631 | 2/1993 |
| JP | H06-67709 A | 3/1994 |
| JP | A-6-95729 | 4/1994 |
| JP | H06-318104 A | 11/1994 |
| JP | H07-060577 | 3/1995 |
| JP | H07-60577 A | 3/1995 |
| JP | A-10-105494 | 4/1998 |
| JP | H11-39018 A | 2/1999 |
| JP | H11-039018 A | 2/1999 |
| JP | A-11-204998 | 7/1999 |
| JP | H11-179682 A | 7/1999 |
| JP | A-2000-035809 | 2/2000 |
| JP | A-2001-255912 | 9/2001 |
| JP | A-2001-320159 | 11/2001 |
| JP | A-2003-5809 | 1/2003 |
| JP | 2003-086654 A | 3/2003 |
| JP | 2004-006938 A | 1/2004 |
| JP | A-2004-6512 | 1/2004 |
| JP | 2004-506319 A | 2/2004 |
| JP | A-2004-104075 | 4/2004 |
| JP | 2004-221518 A | 8/2004 |
| JP | A-2004-265946 | 9/2004 |
| JP | A-2004-280305 | 10/2004 |
| JP | A-2004-319662 | 11/2004 |
| JP | A-2006-261325 | 9/2006 |
| JP | A-2007-98553 | 4/2007 |
| JP | 2007-129130 A | 5/2007 |
| JP | A-2007-129130 | 5/2007 |
| JP | A-2007-158213 | 6/2007 |
| JP | A-2008-60250 | 3/2008 |
| JP | A-2008-153707 | 7/2008 |
| JP | 2008-229738 A | 10/2008 |
| JP | 2008-270322 A | 11/2008 |
| JP | 2009-105351 A | 5/2009 |
| JP | A-2009-123895 | 6/2009 |
| JP | 2009-172689 A | 8/2009 |
| WO | 2004/047512 A1 | 6/2004 |

OTHER PUBLICATIONS

Office Action issued in Japanese Patent Application No. 2010-104661 dated Jan. 28, 2014 (with translation).
Oct. 10, 2014 Office Action issued in Chinese Application No. 201180021073.3.
U.S. Appl. No. 13/643,347 in the name of Iwaki et al.
International Preliminary Report on Patentability issued in International Application No. PCT/JP2011/056060 on Dec. 10, 2012.
Office Action issued in Japanese Patent Application No. 2010-104661 dated Jun. 24, 2014 (with translation).
Office Action and Search Report issued in Chinese Patent Application No. 201180021080.3 dated Jul. 28, 2014 (with translation).
Office Action issued in Japanese Patent Application No. 2010-122483 mailed on Aug. 26, 2014 (with translation).
Office Action issued in Chinese Application No. 201180021302.1 dated Aug. 5, 2014 (with translation).
Report of Reconsideration by Examiner before Appeal issued in Japanese Application No. 2010-122484 dated Sep. 3, 2014 (with translation).
May 17, 2011 International Search Report issued in International Patent Application No. PCT/JP2011/057812.
Dec. 10, 2012 International Preliminary Report on Patentability issued in International Patent Application No. PCT/JP2011/057812 (with translation).
Dec. 20, 2012 International Preliminary Report on Patentability issued in International Patent Application No. PCT/JP2011/057815.
May 17, 2011 International Search Report issued in Patent Application No. PCT/JP2011/057815.
International Search Report issued in International Patent Application No. PCT/JP2011/057816 dated May 17, 2011.
Written Opinion issued in International Patent Application No. PCT/JP2011/057816 dated May 17, 2011.
International Preliminary Report on Patentability issued in International Patent Application No. PCT/JP2011/057816 dated Dec. 10, 2012.
Nov. 19, 2013 Office Action issued in Japanese Application No. 2010-122484 (with English translation).
Nov. 19, 2013 Office Action issued in Japanese Application No. 2010-125545 (with English translation).
Nov. 12, 2013 Office Action issued in Japanese Application No. 2010-104661 (with English translation).
U.S. Appl. No. 13/641,637 in the name of Kodama et al., filed Oct. 16, 2012.
U.S. Appl. No. 13/643,437 in the name of Kodama et al., filed Oct. 31, 2012.
U.S. Appl. No. 13/643,398 in the name of Kodama et al., filed Oct. 31, 2012.
Apr. 12, 2011 International Search Report issued in International Application No. PCT/JP2011/056060 (with translation).
Office Action issued in Japanese Patent Application No. 2010-122484 dated Feb. 6, 2014 (with translation).
Dec. 24, 2014 Office Action issued in Japanese Application No. 2014-083338.
Jan. 6, 2015 Office Action issued in Japanese Application No. 2014-055980.
Oct. 20, 2014 Office Action issued in Chinese Application No. 201180021362.3.
Nov. 18, 2014 Office Action issued in Japanese Application No. 2014-007549.
Dec. 16, 2014 Office Action issued in Japanese Patent Application No. JP2014-008009.
Feb. 24, 2015 Office Action issued in U.S. Appl. No. 13/643,437.
Jan. 8, 2015 Office Action issued in U.S. Appl. No. 13/643,347.
Mar. 3, 2015 Office Action issued in Japanese Patent Application No. 2014-055981.
Mar. 24, 2015 Office Action issued in Japanese Patent Application No. 2014-090948.
Sep. 1, 2015 Office Action issued in Japanese Patent Application No. 2014-212430.
Jun. 30, 2015 Office Action issued in Japanese Patent Application No. 2014-083338.
Jul. 29, 2015 Office Action issued in U.S. Appl. No. 13/643,347.
Aug. 11, 2015 Office Action issued in U.S. Appl. No. 13/643,437.
May 8, 2015 Office Action issued in U.S. Appl. No. 13/643,347.

(56) References Cited

OTHER PUBLICATIONS

May 8, 2015 Office Action issued in U.S. Appl. No. 13/643,398.
Nov. 10, 2015 Office Action cited in Japanese Patent Application No. 2014-090948.
Dec. 2, 2015 Office Action issued in U.S. Appl. No. 13/643,398.
Jan. 29, 2016 Office Action Issued in U.S. Appl. No. 13/643,437.
Mar. 29, 2016 Office Action cited in Japanese Patent Application No. 2014-212430.

* cited by examiner

FIG.3

| |
|---|
| SUBSTRATE IS CONVEYED BY CONVEYOR TO SPECIFIC POSITION |
| HEAD CAMERA IS MOVED BY MOVING DEVICE TO IMAGE TAKING POSITION OF SUBSTRATE |
| IMAGE OF SUBSTRATE IS TAKEN BY HEAD CAMERA AND IMAGE DATA IS PROCESSED |
| DISPENSER IS MOVED BY MOVING DEVICE TO ADHESIVE APPLICATION POSITION |
| SPECIFIC AMOUNT OF ADHESIVE IS APPLIED TO SUBSTRATE BY DISPENSER |
| COMPONENT TRAY ON WHICH COMPONENTS ARE PLACED IS SUPPLIED BY SUPPLIER |
| MOUNTER IS MOVED BY MOVING DEVICE TO COMPONENT SUPPLY POSITION |
| COMPONENT IS HELD BY MOUNTER |
| MOUTER IS MOVED ABOVE BASE CAMERA BY MOVING DEVICE |
| IMAGE OF COMPONENT HELD BY MOUNTER IS TAKEN BY BASE CAMERA AND IMAGE DATA IS PROCESSED |
| MOUNTER IS MOVED BY MOVING DEVICE TO MOUNTING POSITION |
| COMPONENT IS SEPARATED BY MOUNTER |
| SUBSTRATE IS CONVEYED BY CONVEYOR TO SPECIFIC POSITION |

FIG.4A

| MOTION COMMAND No. | MAIN COMMAND | ASSOCIATED COMMAND | COMMAND STATE |
|---|---|---|---|
| (i) | CONVEYOR: CONVEYANCE | CONVEYANCE AMOUNT | COMMAND ISSUING OR COMMAND ABSENT |
| (ii) | MOVING DEVICE: MOVEMENT | MOVEMENT AMOUNT | COMMAND ISSUING OR COMMAND ABSENT |
| (iii) | HEAD CAMERA: IMAGE TAKING | | COMMAND ISSUING OR COMMAND ABSENT |
| (iv) | MOVING DEVICE: MOVEMENT | MOVEMENT AMOUNT | COMMAND ISSUING OR COMMAND ABSENT |
| (v) | DISPENSER: EJECTION | EJECTION AMOUNT | COMMAND ISSUING OR COMMAND ABSENT |
| (vi) | SUPPLIER: SUPPLY | COMPONENT TRAY No. | COMMAND ISSUING OR COMMAND ABSENT |
| (vii) | MOVING DEVICE: MOVEMENT | MOVEMENT AMOUNT | COMMAND ISSUING OR COMMAND ABSENT |
| (viii) | MOUNTER: HOLDING | | COMMAND ISSUING OR COMMAND ABSENT |
| (ix) | MOVING DEVICE: MOVEMENT | MOVEMENT AMOUNT | COMMAND ISSUING OR COMMAND ABSENT |
| (x) | BASE CAMERA: IMAGE TAKING | | COMMAND ISSUING OR COMMAND ABSENT |
| (xi) | MOVING DEVICE: MOVEMENT | MOVEMENT AMOUNT | COMMAND ISSUING OR COMMAND ABSENT |
| (xii) | MOUNTER: SEPARATION | | COMMAND ISSUING OR COMMAND ABSENT |
| (xiii) | CONVEYOR: CONVEYANCE | CONVEYANCE AMOUNT | COMMAND ISSUING OR COMMAND ABSENT |

FIG.4B

| OPERATION RESULT | COMMAND STATE | STATE OF WORK-ELEMENT PERFORMING APPARATUS |
|---|---|---|

MANUFACTURE WORK MACHINE AND MANUFACTURE WORK SYSTEM

TECHNICAL FIELD

The present invention relates to a manufacture work machine configured to perform a manufacture work on a base member by a plurality of work-element performing apparatuses and a manufacture work system including the manufacture work machine.

BACKGROUND ART

As a manufacture work machine for performing a manufacture work on a base member such as assembling of the other component, application of an auxiliary agent, or processing and/or treatment, there is known a manufacture work machine which includes a plurality of work-element performing apparatuses each configured to perform one of a plurality of work elements that constitute the manufacture work, more specifically, to perform conveyance and movement of the base member, supplying of the base member or the other component or holding and separation of the base member or the other component. The known manufacture work machine is configured to perform the manufacture work by controlling the plurality of work-element performing apparatuses by means of a central control device. The following Patent Literature describes a robot system which employs a plurality of robots instead of the plurality of work-element performing apparatuses and in which each of the plurality of robots has an individual control device for controlling an operation of a corresponding one of the robots on the basis of a motion command transmitted from the central control device.

CITATION LIST

Patent Literature

[Patent Literature 1] JP-A-2007-98553

DISCLOSURE OF INVENTION

(A) Summary of Invention

Like the robot system described in the above Patent Literature, the manufacture work machine may be configured such that each of the plurality of work-element performing apparatuses has an individual control device for controlling an operation of a corresponding one of the work-element performing apparatuses on the basis of a motion command transmitted from the central control device. In the thus configured manufacture work machine, in association with a change of the manufacture work, for instance, one of the plurality of work-element performing apparatuses may be replaced with another work-element performing apparatus, and said another work-element performing apparatus may be controlled by the central control device. That is, the central control device may be used as a general-purpose device, and the work-element performing apparatus as a special-purpose apparatus may be changed depending upon purposes. It is desirable that the number of procedures to be taken in association with the replacement of the work-element performing apparatus be small. It is possible to enhance practical utility of the manufacture work machine in which the work-element performing apparatuses are exchangeable, by taking some measures for reducing the number of procedures to be taken in association with the replacement of the work-element performing apparatus. The present invention has been made in view of the above. It is therefore an object of the invention to enhance practical utility of a manufacture work machine which includes a central control device and a plurality of work-element performing apparatuses and in which the work-element performing apparatuses are exchangeable depending upon purposes and to enhance practical utility of a manufacture work system having such a manufacture work machine.

To solve the problem described above, a manufacture work machine according to the present invention is configured such that a central control device transmits, according to one protocol, a motion command in a specific programming language to an individual control device of each of a plurality of work-element performing apparatuses and such that the individual control device of each of the plurality of work-element performing apparatuses receives, according to the one protocol, the motion command and converts the received motion command into a motion command in a programming language that the individual control device uses. Further, a manufacture work system according to the present invention is constituted by the manufacture work machine.

A considerably large number of programming languages are currently used, and the programming languages used in the respective work-element performing apparatuses often differ from each other. Accordingly, where one work-element performing apparatus is replaced with another work-element performing apparatus, a program, etc., of the central control device are changed in general so as to enable the central control device to transmit the motion command in a programming language which is used in said another work-element performing apparatus. It is often needed to also change a communication protocol, etc., for transmitting the motion command. In the manufacture work machine according to the present invention, the motion command transmitted by the central control device is transmitted in a specific programming language according to one communication protocol, irrespective of the destination work-element performing apparatus to which the motion command is transmitted. Further, the transmitted motion command is converted, in the individual control device of each of the plurality of work-element performing apparatuses, into a motion command in a programming language that corresponds to the individual control device. That is, it is conventionally required to change the program, the communication protocol, etc., of the central control device in association with the replacement of the work-element performing apparatus. In the manufacture work machine according to the present invention, however, each work-element performing apparatus is configured to convert the motion command into a motion command in a programming language compatible thereto. Accordingly, it is not required to change the program, the communication protocol, etc., of the central control device in association with the replacement of the work-element performing apparatus. Therefore, the manufacture work machine according to the present invention reduces the number of procedures to be taken in association with the replacement of the work-element performing apparatus, thereby enhancing practical utility of the manufacture work machine in which the work-element performing apparatuses are exchangeable depending upon purposes. Further, since the manufacture work system according to the present invention includes the above-described manufacture work machine according to the present invention, the manufacture work system ensures high practical utility.

(B) Forms of Invention

There will be explained various forms of an invention which is considered claimable (hereinafter referred to as "claimable invention" where appropriate). Each of the forms is numbered like the appended claims and depends from the other form or forms, where appropriate. This is for easier understanding of the claimable invention, and it is to be understood that combinations of constituent elements that constitute the invention are not limited to those described in the following forms. That is, it is to be understood that the claimable invention shall be construed in the light of the following description of various forms and embodiments. It is to be further understood that any form in which one or more constituent elements is/are added to or deleted from any one of the following forms may be considered as one form of the claimable invention. Some of the forms of the claimable invention correspond to inventions relating to claims described in CLAIMS.

More specifically, in the following forms, the forms (1)-(25) correspond to claims 1-25, respectively.

(1) A manufacture work machine for performing, on a base member, a manufacture work such as assembling of other component, application of an auxiliary agent, or processing and/or treatment, comprising:

a plurality of work-element performing apparatuses each of which is configured to perform one of a plurality of work elements that constitute the manufacture work, such as conveyance and movement of the base member, supplying of the base member or the other component, holding and separation of the base member or the other component, movement and change of a position of the holding and a position of the separation, ejection of the auxiliary agent, performance of the processing and/or treatment, and movement and change of a performance position of the processing and a performance position of the treatment; and a central control device configured to control the plurality of work-element performing apparatuses in a centralized manner, wherein each of the plurality of work-element performing apparatuses includes an individual control device configured to control an operation thereof, and the individual control device is configured to control the operation of one of the plurality of work-element performing apparatuses that is controlled by the individual control device, on the basis of a motion command transmitted from the central control device, wherein the central control device includes a central communication section and is configured to transmit, according to one protocol, the motion command in a specific programming language, via the central communication section, and wherein the individual control device includes (a) an individual communication section configured to receive, according to the one protocol, the motion command transmitted from the central control device and (b) a command converting section configured to convert the motion command received by the individual communication section into a motion command in a programming language that the individual control device can handle, the individual control device being configured to control the one of the plurality of work-element performing apparatuses that is controlled by the individual control device, on the basis of the motion command converted by the command converting section.

In the manufacture work machine in which each of the plurality of work-element performing apparatuses has an individual control device configured to control the operation of the corresponding work-element performing apparatus and the individual control device controls the operation of the corresponding work-element performing apparatus on the basis of the motion command transmitted from the central control device, it is possible to use the central control device and the work-element performing apparatus as the general-purpose device and the special-purpose apparatus, respectively, so as to replace the work-element performing apparatus depending upon purposes. Accordingly, the thus constructed manufacture work machine enables a reduction in a cost and a time required for development and production of various manufacture work machines. However, the number of programming languages that are currently used is considerably large, and the programming languages used in the respective work-element performing apparatuses often differ from each other. Accordingly, where one work-element performing apparatus is replaced with another work-element performing apparatus, a program, etc., of the central control device is changed in general so as to enable the central control device to transmit the motion command in a programming language which is used in said another work-element performing apparatus. It is often needed to also change a communication protocol, etc., for transmitting the motion command. In other words, in replacing the work-element performing apparatus, it is generally needed to take some procedures such as changing of the program, the communication protocol, etc., of the central control device. Accordingly, the replacement of the work-element performing apparatus involves a great deal of trouble.

In the manufacture work machine according to this form, the motion command transmitted by the central control device is transmitted in a specific programming language according to the one protocol irrespective of the destination work-element performing apparatus. Further, each of the individual control devices of the respective work-element performing apparatuses is configured to receive the motion command according to the one protocol and to convert the received motion command into a motion command in a programming language that the individual control device uses. That is, according to the present invention, each of the individual control devices of the respective work-element performing apparatuses is configured on purpose to have a converting function into a motion command in a programming language that the individual control device can handle. Although it takes a trouble and a cost to permit each of the individual control devices of the respective work-element performing apparatuses to have such a converting function, it is not necessary to change the program, the communication protocol, etc., of the central control device in replacing the work-element performing apparatus, thereby reducing the trouble in replacing the work-element performing apparatus to a considerable extent. Therefore, according to the manufacture work machine in this form, it is possible to considerably reduce the procedures to be taken in replacing the work-element performing apparatus depending upon purposes, thereby making it possible to enhance practical utility of the manufacture work machine in which the work-element performing apparatuses are exchangeable.

The "base member" described in this form constitutes a product, a component, etc., to be manufactured by the manufacture work and may be one member or a combination of a plurality of members. The "work element" in this form corresponds to an assembling work element which constitutes an assembling work with respect to the base member, a pre-treatment work element which constitutes a pre-treatment work for the assembling work, a post-treatment work element which constitutes a post-treatment work for the assembling work, a position change work element which is for changing and moving a position of the assembling work, the pre-treatment work, or the post-treatment work, etc. The "assembling work element" includes supplying of the base member or the other component, holding and separation of the base member or the other component, and fastening of a fastening component such as a screw. The "pre-treatment work element" includes ejection of the auxiliary agent, cleaning and washing of the base member, the other component, or a manufacture line, and image taking of the base member or the other component. The "post-treatment work element" includes bonding of members, drying and curing of the auxiliary agent, and inspection after the assembling or the processing and/or the treatment. The "position change work element" includes conveyance and movement of the base member, movement and change of a position of the holding and a position of the separation, movement and change of a performance position of the processing and/or treatment, and movement and change of a position of the image taking.

The "manufacture work" described in this form is performed on the base member. The manufacture work may be performed on a member to which the base member is assembled, without being performed directly on the base member. That is, the manufacture work may be performed on the other component mounted on the base member. The "protocol" described in this form is for defining an agreement, a procedure, a rule or the like as to communication between the central control device and the individual control device. The "protocol" in this form includes not only an agreement of communication data itself, but also an agreement of a transmission path of data or the like between the central control device and the individual control device, more specifically, an agreement of the kind of cables and connectors in wired communication and an agreement of frequency bands in wireless communication. The "individual control device" described in this form may be incorporated or attached to a main body which actually operates for performing the work element or may be provided separate from the main body. That is, the work-element performing apparatus may or may not constitute a unit.

The "manufacture work machine" described in this form is configured to perform various works such as the assembling work with respect to the base member, the pre-treatment and/or processing for the assembling work, and the post-treatment and/or processing for the assembling work. The manufacture work machine is configured to perform one kind or a plural kinds of works. That is, the manufacture work machine may be configured to perform the pre-treatment and/or processing for the assembling work and the assembling work with respect to the base member. To be more specific, the manufacture work machine may be configured to apply the adhesive to the base member and to perform the assembling work in which the other component is assembled to the base member at the position at which the adhesive has been applied. However, the manufacture works that can be performed by a single manufacture work machine are limited. Accordingly, the "manufacture work machine" described in this form is treated as one module, and a plurality of manufacture work machines are arranged so as to permit the manufacture work machines each as the module to perform the respective manufacture works, whereby a plurality of kinds of manufacture works can be performed. In other words, it is possible to manufacture products or components, etc., with a certain degree of complexity.

(2) The manufacture work machine according to the form (1), further comprising a plurality of communication cables which are provided respectively for the plurality of work-element performing apparatuses and each of which is for transmitting the motion command from the central communication section of the central control device to the individual communication section of the individual control device, wherein the plurality of communication cables are identical in kind.

In the manufacture work machine described in this form, an interface between the individual control device of each of the plurality of work-element performing apparatuses and the central control device is unified, and an input/output port is unified. According to this form, it is possible to easily carry out replacement of the work-element performing apparatus.

(3) The manufacture work machine according to the form (1) or (2), wherein the central control device is configured to transmit the motion command including (a) a main command for commanding one of initiation and termination of one motion performed by any one of the plurality of work-element performing apparatuses and (b) an associated command which is associated to the main command as needed for transmitting a motion parameter of the one motion, the motion parameter including any of a direction, an amount, a time, and a speed of the conveyance and the movement, an amount, a time, and a speed of the ejection of the auxiliary agent, and an amount, a time, and a speed of the performance of the processing and/or the treatment.

In the manufacture work machine described in this form, it is possible to command, by one motion command, not only initiation and termination of one motion of the work-element performing apparatus, but also a motion amount, a motion time, a motion speed, a motion direction, etc., of the one motion. Accordingly, the manufacture work machine described in this form enables the work-element performing apparatus to perform a certain degree of complex operation by one motion command. The "one motion" described in this form is a motion of the work-element performing apparatus when the work-element performing apparatus performs a work element by one motion command. For instance, the one motion of the conveyor is a series of conveyance motions by one motion command. Further, the "motion parameter" described in this form is a parameter to be used when the work-element performing apparatus performs one motion and is the so-called argument.

(4) The manufacture work machine according to any one of the forms (1)-(3), wherein the central control device includes a motion-command storage section configured to store a plurality of motion commands necessary for performing a specific manufacture work, and wherein the central control device is configured to sequentially transmit the plurality of motion commands stored in the motion-command storage section to the individual control device of any of the plurality of work-element performing apparatuses.

The manufacture work machine described in this form is configured such that the plurality of work-element performing apparatuses sequentially operate according to a predetermined order. That is, in the manufacture work machine according to this form, the manufacture work is performed according to a sequence control.

(5) The manufacture work machine according to any one of the forms (1)-(4), wherein the central control device includes: a source-code storage section configured to store source codes in which is encoded an operation of each of the plurality of work-element performing apparatuses necessary for the manufacture work machine to perform a specific manufacture work; and a code•command converting section configured to convert the source codes stored in the source-code storage section into motion commands, and wherein the central control device is configured to transmit the motion commands converted by the code•command converting section.

In the manufacture work machine described in this form, a specific manufacture work can be performed according to source codes, namely, according to a program list. The "code•command converting section" described in this form may be configured not only to merely convert the source codes into a plurality of motion commands, but also to arrange the converted motion commands in order in which the motion commands are transmitted to the individual control devices of the respective work-element performing apparatuses. Where the code•command converting section is thus configured, a functional section of the central control device for transmitting the motion commands can be constructed such that the motion commands are transmitted in the arranged order, whereby the functional section can be formed as a functional section in which the necessity to execute complicated processing is low.

(6) The manufacture work machine according to the form (5), wherein the code•command converting section is configured to convert the source codes stored in the source-code storage section into the motion commands by execution of a conversion program, and wherein a programming language of the conversion program is different from a programming language of a transmission program for processing in which the central control device transmits the motion command.

(7) The manufacture work machine according to the form (6), wherein the programming language of the transmission program is a higher-level programming language than the programming language of the conversion program.

The transmission program is a program for transmission processing of the motion command. Where one of the plurality of work-element performing apparatuses is replaced with another work-element performing apparatus, for instance, there may arise a need to change the transmission program so as to correspond to said another work-element performing apparatus. On the other hand, the conversion program is a program for converting the source codes into a motion command in a specific programming language and not for converting the source codes into a motion command in a programming language that corresponds to the work-element performing apparatus. Therefore, it is not necessary to change the conversion program upon replacement of the work-element performing apparatus. In the manufacture work machine according to the latter form, the programming language of the transmission program is easier to understand than the programming language of the conversion program, whereby the programming language of the transmission program can be easily changed. In the manufacture work machine according to the latter form, therefore, even where there may arise a need to change the transmission program due to the replacement of the work-element performing apparatus, the transmission program can be easily changed.

The "transmission program" described in each of the above two forms need not be limited to a program for executing transmission of the motion command, but may be a program for executing processing required to transmit the motion command. More specifically, since transmission of the motion command is based on the precondition that operating states of the plurality of work-element performing apparatuses are normal, the transmission program may be a program for monitoring the operating state of each work-element performing apparatus.

(8) The manufacture work machine according to the form (6) or (7), wherein the programming language of the conversion program is a structured-type programming language.

(9) The manufacture work machine according to any one of the forms (6)-(8), wherein the programming language of the transmission program is a graphic-type programming language.

(10) The manufacture work machine according to any one of the forms (6)-(9), wherein the programming language of the transmission program is a ladder language.

In the manufacture work machine according to each of the above three forms, the programming language of the conversion program or the transmission program is concretely limited. The graphic-type programming language is also referred to as a visual programming language and represents the program using not text but graphical symbols and the like. Hence, the graphic-type programming language is easier to understand than the structured-type programming language which represents the program using text and can be changed to a certain degree even by a person who is not familiar with the programming language. Accordingly, by employing the graphic-type programming language as the programming language of the transmission program, it is possible to easily change the transmission program. In this respect, the graphic-type programming language includes various languages such as a ladder language, a function•block•diagram, and a sequential•function•chart. The structured-type programming language includes various languages such as a C language, FORTRAN, and BASIC.

(11) The manufacture work machine according to any one of the forms (1)-(10), wherein the individual control device is configured to transmit, according to the one protocol, a reply as to termination of one motion which is being performed by one of the plurality of work-element performing apparatuses that is controlled by the individual control device on the basis of one motion command, to the central control device via the individual communication section.

(12) The manufacture work machine according to the form (11), wherein the individual control device is configured to transmit, to the central control device, the reply as to termination of the one motion at a termination time point when the one motion is actually terminated.

(13) The manufacture work machine according to the form (11), wherein the individual control device is configured to transmit, to the central control device, the reply as to termination of the one motion prior to a termination time point, where the termination time point is estimated.

(14) The manufacture work machine according to any one of the forms (11)-(13), wherein the central communication section is configured to receive, according to the one protocol, the reply as to termination of the one motion.

(15) The manufacture work machine according to any one of the forms (11)-(14), wherein the central control device is configured to transmit a next motion command that is to be transmitted subsequent to the one motion command after having received the reply as to termination of the one motion.

In the manufacture work machine according to each of the above five forms, the central control device can grasp termination of the motion of the work-element performing apparatus which is based on the one motion command. The motions of the plurality of work-element performing apparatuses are often correlated. There is an instance in which unless a certain one motion is terminated, the next motion to be performed subsequent to the one motion cannot be performed. More specifically, when a certain member held by the mounter is mounted on the substrate, for instance, the mounter cannot mount the certain member on the substrate unless the mounter is located at a position at which the certain member is mountable on the substrate. That is, the mounter is allowed to separate the certain member at a mounting position on the substrate only after the mounter is moved above the mounting position. In the manufacture work machine according to each of the above five forms, after one motion is terminated, the next motion to be subsequently performed can be performed, like the manufacture work machine according to the last one of the above five forms. Accordingly, a smooth manufacture work is ensured.

(16) The manufacture work machine according to any one of the forms (1)-(15), wherein the individual control device is configured to transmit, according to the one protocol, information that one of the plurality of work-element performing apparatuses that is controlled by the individual control device is in an operation-difficult situation in which an operation of the one of the plurality of work-element performing apparatuses is difficult, to the central control device via the individual communication section.

(17) The manufacture work machine according to the form (16), wherein the central communication section is configured to receive, according to the one protocol, the information that the one of the plurality of work-element performing apparatuses is in the operation-difficult situation.

In the manufacture work machine according to each of the above two forms, the central control device can grasp that the one of the work-element performing apparatuses is in the operation-difficult situation by a notice from the one work-element performing apparatus that is in the operation-difficult situation, and it is possible to judge whether or not the manufacture work machine can perform the manufacture work appropriately. The "individual control device" described in the former form may transmit, to the central control device, information that the work-element performing apparatus is in the operation-difficult situation where the operation of the work-element performing apparatus based on the motion command is difficult or may transmit, to the central control device, the information where the operation of the work-element performing apparatus is difficult irrespective of presence or absence of the motion command.

(18) The manufacture work machine according to the form (16) or (17), wherein the central control device includes an operation-difficult-situation handling section configured to handle the operation-difficult situation where the central control device receives the information that the one of the plurality of work-element performing apparatuses is in the operation-difficult situation.

In the manufacture work machine according to this form, in an instance where the manufacture work machine cannot perform the manufacture work appropriately, it is possible to handle such a situation. The "operation-difficult-situation handling section" described in this form may be configured to suspend transmission of the motion command to the individual control device as later explained in detail or may be configured to inhibit the operation of the work-element performing apparatus, in an instance where the central control device receives the information that the work-element performing apparatus is in the operation-difficult situation. The "operation-difficult-situation handling section" may be configured to notify an operator of the manufacture work machine of abnormality of the work-element performing apparatus by means of an indicator lamp, a buzzer, or the like.

(19) The manufacture work machine according to the form (18), wherein the operation-difficult-situation handling section is configured to suspend transmission of the motion command to the individual control device of the one of the plurality of work-element performing apparatuses where the central control device receives the information that the one of the plurality of work-element performing apparatuses is in the operation-difficult situation.

The "operation-difficult-situation handling section" described in this form may be configured such that, where the central control device receives the information that the one of the work-element performing apparatuses is in the operation-difficult situation, the motion command is not transmitted only to the one work-element performing apparatus or the motion command is not transmitted to the one work-element performing apparatus and the other work-element performing apparatuses.

(20) The manufacture work machine according to any one of the forms (1)-(19), wherein the individual control device includes an operation-information storage section configured to store information as to an operation of one of the plurality of work-element performing apparatuses that is controlled by the individual control device, such as a result of performance of one motion by the one of the plurality of work-element performing apparatuses, performance capabilities of the one of the plurality of work-element performing apparatuses for performing the operation, and a control gain upon control of the operation of the one of the plurality of work-element performing apparatuses.

In the manufacture work machine described in this form, the individual control device is configured to store information inherent to a corresponding one of the work-element performing apparatuses that is controlled by the individual control device, such as a result of the motion of the work-element performing apparatus, performance capabilities of a drive source or the like of the work-element performing apparatus, and a control gain or the like used to determine a supply power to the drive source or the like.

(21) The manufacture work machine according to the form (20),
wherein the individual control device is configured to transmit, according to the one protocol, the information as to the operation stored in the operation-information storage section to the central control device via the individual communication section, and
wherein the central control device includes an operation-information management section configured to manage the information as to the operation transmitted thereto.

(22) The manufacture work machine according to the form (21), the central communication section is configured to receive, according to the one protocol, the information as to the operation stored in the operation-information storage section.

In the manufacture work machine described in the above two forms, the information inherent to the work-element performing apparatus is stored in the individual control device of the work-element performing apparatus and in the central control device. Accordingly, in the manufacture work machine described in the above two forms, the information inherent to the work-element performing apparatus can be backed up, ensuring protection of the information.

(23) The manufacture work machine according to any one of the forms (1)-(22),
wherein each of the plurality of work-element performing apparatuses includes a main body configured to actually operate for performing one of the plurality of work elements, and
wherein, in at least one of the plurality work-element performing apparatuses, the individual control device is fixed to a part of the main body, so that the at least one of the plurality work-element performing apparatuses constitutes a unit.

Where the work-element performing apparatus is configured to constitute a unit, it is easy to replace the work-element performing apparatus. In this form, the work-element performing apparatus that constitutes a unit may be the work-element performing apparatus in which the main body and the individual control device are combined. To be more specific, the individual control device may be incorporated into a casing or the like of the main body or the individual control device may be fixed to an outside of a casing of the main body or an outside of a member functioning as the base body.

(24) The manufacture work machine according to any one of the forms (1)-(23), further comprising a base, wherein each of the plurality of work-element performing apparatuses is configured to be attachable to and detachable from one of the base and another of the plurality of work-element performing apparatuses.

In the manufacture work machine described in this form, it is preferable that the work-element performing apparatus be easily attached to and detached from the base or another work-element performing apparatus for easy replacement of the work-element performing apparatus. More specifically, it is preferable that the work-element performing apparatus be attachable to and detachable from the base or another work-element performing apparatus by fastening action with several bolts, etc., or by one-touch action, for instance.

(25) A manufacture work system comprising a plurality of manufacture work machines arranged such that manufacture works by the respective plurality of manufacture work machines are sequentially performed on a base member as a work target while the base member is conveyed from an upstream one of the plurality of manufacture work machines toward a downstream one of the plurality of manufacture work machines.

In a single manufacture work machine, the number of manufacture steps that can be performed is comparatively small. However, a comparatively large number of manufacture steps can be performed by constructing a system in which a plurality of manufacture work machines are arranged and in which the manufacture works by the plurality of manufacture work machines can be sequentially performed. In other words, it is possible to manufacture products or components with a certain degree of complexity.

BRIEF DESCRIPTION OF DRAWINGS

FIG. 3 is a table showing source codes stored in the central control device of FIG. 2.

FIG. 4 is a table showing a data format of motion commands and a data format of a reply to a motion command.

DESCRIPTION OF EMBODIMENTS

There will be hereinafter explained in detail embodiments of the claimable invention with reference to the drawings. It is to be understood that the claimable invention may be embodied with various changes and modifications based on the knowledge of those skilled in the art, in addition to the following embodiments and various forms described in the FORMS OF INVENTION.

Embodiments

<Structure of Manufacture Work Machine>

Figure 1:
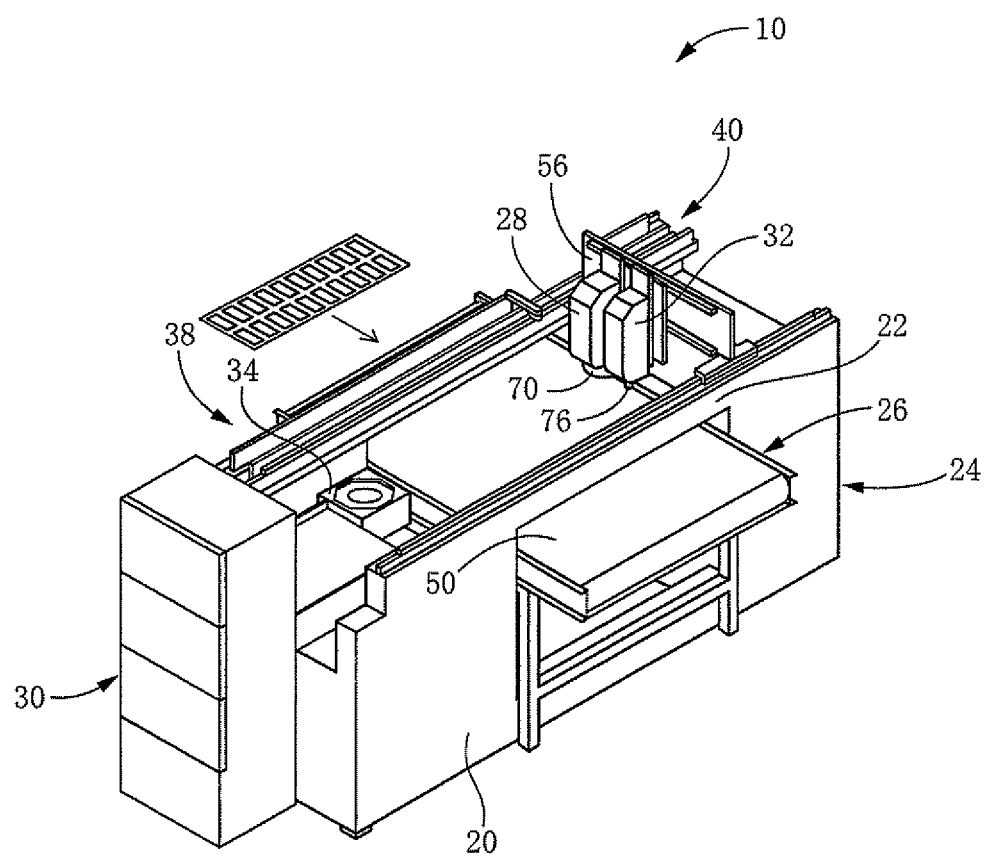
FIG. 1 is a perspective view showing a manufacture work machine according to one embodiment of the claimable invention.

FIG. 1 shows a manufacture work machine 10 according to the claimable invention. The manufacture work machine 10 is configured to carry out mounting of an electronic circuit component or part (hereinafter abbreviated as "component" where appropriate) with respect to a circuit substrate as a base member and application of an adhesive. The manufacture work machine 10 includes: a main body 24, as a base, including a frame portion 20 and a beam portion 22 disposed over the frame portion 20; a conveyor 26 configured to convey the circuit substrate; a mounter 28 configured to mount the component on the circuit substrate; a supplier 30 disposed at one end of the frame portion 20 and configured to supply the component to the mounter 28; a dispenser 32 configured to apply an adhesive to the circuit substrate; a camera device 38 including a base camera 34 disposed between the supplier 30 and the conveyor 26 and a head camera 36 (FIG. 7) disposed rearward of the mounter 28; and a moving device 40 disposed in the beam portion 22 and configured to move the mounter 28, the dispenser 32, and the head camera 36 in a region. Here, a longitudinal direction of the manufacture work machine 10 is referred to as a front-rear direction, a horizontal direction perpendicular to the longitudinal direction is referred to as a left-right direction, and a vertical direction perpendicular to the longitudinal direction is referred to as an up-down direction. Since each of the apparatuses 26, 28, 30, 32, 38, 40 that constitute the manufacture work machine 10 is known, an explanation thereof will be briefly made.

Figure 2:
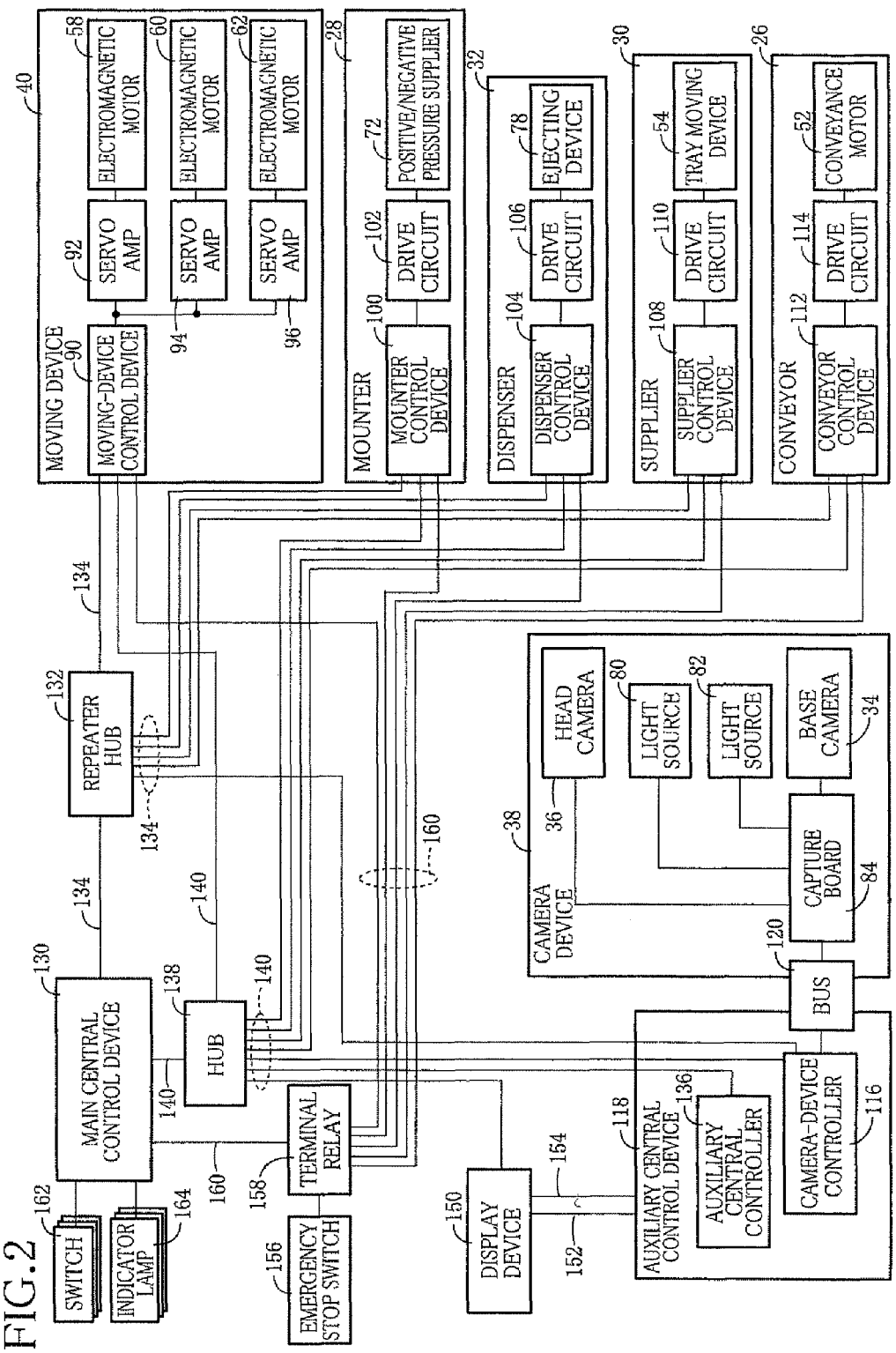
FIG. 2 is a schematic view of a central control device and a plurality of work-element performing apparatuses of the manufacture work machine of FIG. 1.

The conveyor 26 is configured to convey the circuit substrate placed on a conveyor belt 50 in the left-right direction by rotating the conveyor belt 50 by a conveyance motor 52 (FIG. 2). That is, the conveyor 26 functions as a work-element performing apparatus configured to perform conveyance and send-out of the circuit substrate to and from a specific position, as a work element. The supplier 30 is a tray unit type supplier and includes: a plurality of component trays (not shown) on each of which components are placed; and a tray moving device 54 (FIG. 2) configured to move any of the plurality of component trays to a position at which the component can be supplied to the mounter 28. That is, the supplier 30 functions as a work-element performing apparatus configured to perform supplying of the components, as a work element.

The moving device 40 is an XYZ-robot-type moving device and includes: an electromagnetic motor 58 (FIG. 2) for permitting a slider 56 that holds the mounter 28, the dispenser 32, and the head camera 36 to slidingly move in the left-right direction; an electromagnetic motor 60 (FIG. 2) for permitting the slider 56 to slidingly move in the front-rear direction; and an electromagnetic motor 62 (FIG. 2) for permitting the slider 56 to slidingly move in the up-down direction. The operations of the electromagnetic motors 58, 60, 62 enable the mounter 28, the dispenser 32, and the head camera 36 to respective arbitrary positions. That is, the moving device 40 functions as a work-element performing apparatus configured to perform a movement of the mounter 28, the dispenser 32, and the head camera 36.

The mounter 28 is fixedly held by the slider 56 of the moving device 40 and includes, at its lower end, a component holder 70. The component holder 70 communicates with a negative-pressure air passage and a positive-pressure air passage via a positive/negative pressure supplier 72 (FIG. 2) and is configured to suction-hold the component by a negative pressure and to separate the suction-held component by a slight positive pressure supplied thereto. That is, the mounter 28 functions as a work-element performing apparatus configured to perform holding and separation of the component, as a work element. The dispenser 32 is fixedly held by the slider 56 of the moving device 40 and includes: a dispenser nozzle 76 provided at a lower end of the dispenser 32 for ejecting an adhesive; and an ejecting device 78 (FIG. 2) for permitting ejection of an arbitrary amount of the adhesive from the dispenser nozzle 76. That is, the dispenser 32 functions as a work-element performing apparatus configured to perform ejection of the adhesive, as a work element.

The camera device 38 is constituted by: a head camera 36 fixedly disposed at a lower portion of the slider 56 so as to face downward; a light source 80 (FIG. 2) for the head camera 36; a base camera 34 fixedly disposed between the supplier 30 and the conveyor 26 so as to face upward; a light source 82 (FIG. 2) for the base camera 34; and a capture board 84 (FIG. 2) connected to the head camera 36, the base camera 34, and the light sources 80, 82. The head camera 36 is capable of taking an image of the circuit substrate on the conveyor 26 while the base camera 34 is capable of taking an image of the component which is suction-held by the mounter 28. That is, the camera device 38 functions as a work-element performing apparatus configured to perform image taking of the circuit substrate and the component, as a work element.

Since the moving device 40 is for moving the mounter 28, the dispenser 32, and the head camera 36, the moving device 40 may be considered as a work-element performing apparatus configured to perform a movement of other work-element performing apparatus. Further, since the moving device 40 changes a holding position and a separation position of the component in association with the movement of the mounter 28, the moving device 40 may be considered as a work-element performing apparatus configured to perform a movement and a change of the holding position and the separation position of the component. Moreover, since the moving device 40 changes an ejection position of the adhesive and an image taking position of the circuit substrate in association with movement of the dispenser 32 and the movement of the head camera 36, the moving device 40 may be considered as a work-element performing apparatus configured to perform a movement and a change of the ejection position of the adhesive and the image taking position of the circuit substrate.

The present manufacture work machine 10 is constituted by six work-element performing apparatuses, namely, the conveyor 26, the mounter 28, the supplier 30, the dispenser 32, the camera device 38, and the moving device 40. The six work-element performing apparatuses individually include respective control devices, as shown in FIG. 2. More specifically, the moving device 40 includes: a moving-device control device 90, as the individual control device, for controlling the operations of the respective three electromagnetic motors 58, 60, 62; and three servo amps 92, 94, 96 that correspond to the respective three electromagnetic motors 58, 60, 62. The moving-device control device 90 is configured to send control signals to each servo amp 92, 94, 96, thereby controlling the operations of the respective electromagnetic motors 58, 60, 62. The mounter 28 includes: a mounter control device 100, as the individual control device, for controlling the operation of the positive/negative pressure supplier 72; and a drive circuit 102 for the positive/negative pressure supplier 72. The mounter control device 100 is configured to send a control signal to the drive circuit 102, thereby controlling the operation of the positive/negative pressure supplier 72.

The dispenser 32 includes: a dispenser control device 104, as the individual control device, for controlling the operation of the ejecting device 78; and a drive circuit 106 for the ejecting device 78. The dispenser control device 104 is configured to send a control signal to the drive circuit 106, thereby controlling the operation of the ejecting device 78. The supplier 30 includes: a supplier control device 108, as the individual control device, for controlling the operation of the tray moving device 54; and a drive circuit 110 for a motor as a drive source of the tray moving device 54. The supplier control device 108 is configured to send a control signal to the drive circuit 110, thereby controlling the operation of the tray moving device 54. The conveyor 26 includes: a conveyor control device 112, as the individual control device, for controlling the operation of the conveyance motor 52; and a drive circuit 114 for the conveyance motor 52. The conveyor control device 112 is configured to send a control signal to the drive circuit 114, thereby controlling the operation of the conveyance motor 52.

The camera device 38 includes, as the individual control device, a camera-device controller 116 for executing transmission of a control signal to perform image taking by the base camera 34 or the head camera 36 and for executing processing of image data obtained by the image taking. While the camera-device controller 116 is provided in an auxiliary central control device 118 which will be explained, the camera-device controller 116 is independent in the auxiliary central control device 118 and is connected to the capture board 84 of the camera device 38 via a bus 120. Therefore, the camera-device controller 116 is not treated as a constituent element of the auxiliary central control device 118, but is treated as a constituent element of the camera device 38.

The manufacture work machine 10 further includes a central control device constituted by: a main central control device 130 configured to control the six work-element performing apparatuses 26, 28, 30, 32, 38, 40 in a centralized manner; and the auxiliary central control device 118. The main central control device 130 is mainly for transmitting a motion command to each of the individual control devices 90, 100, 104, 108, 112, 116 of the respective apparatuses 26, 28, 30, 32, 38, 40. The main central control device 130 is connected, via a repeater hub 132, to the respective individual control devices 90, 100, 104, 108, 112, 116 by respective serial communication cables 134 of the same kind for transmission of the motion commands. The auxiliary central control device 118 includes an auxiliary central controller 136. In the auxiliary central controller 136, there is stored a source program which is a basis of the motion commands to the individual control device 90, etc., namely, source codes for performing a specific manufacture work. (Hereinafter, "the individual control device 90, etc." collectively refer to each of the individual control devices 90, 100, 104, 108, 112, 116 where appropriate.) In the stored source codes, the operation of each of the six work-element performing apparatuses 26, etc., is encoded. The auxiliary central controller 136 is configured to convert the source codes into the motion commands in accordance with a certain specific programming language and to transmit the converted motion commands to the main central control device 130. The auxiliary central controller 136 and the main central control device 130 are connected to each other by a LAN cable 140 via a hub 138, and the motion commands converted in the auxiliary central controller 136 are transmitted to the main central control device 130 via the LAN cable 140. To the hub 138, one end of each of six LAN cables 140 which are identical to the LAN cable 140 in kind is connected, and another end of each of the six LAN cables 140 is connected to a corresponding one of the individual control devices 90, etc., of the respective work-element performing apparatuses 26, etc. (Hereinafter, "the work-element performing apparatus 26, etc." collectively refer to each of the work-element performing apparatuses 26, 28, 30, 32, 38, 40 where appropriate.) Each of the serial communication cables 134 and the LAN cables 140 is constituted by a wire portion and connector portions, each of which may be a general-purpose item or a special item developed exclusively for the present manufacture work machine 10.

The manufacture work machine 10 further includes a display device 150 of a touch-panel type through which information as to the operation of the manufacture work machine 10 is inputted and outputted. The display device 150 is connected to: the main central control device 130 by a LAN cable 140 which is identical to the LAN cables 140 in kind via the hub 138; and the auxiliary central controller 136 by a serial communication cable 152 and an RGB analog cable 154. The manufacture work machine 10 further includes an emergency stop switch 156 which is connected to the main central control device 130 and the individual control device 90, etc., of the work-element performing apparatus 26, etc., by I/O cables 160 via a terminal relay 158. To the main central control device 130, there are connected: a plurality of switches 162 such as a power source switch and a startup switch of the manufacture work machine 10; and a plurality of indicator lamps 164 such as an indicator lamp indicating that the manufacture work machine 10 is in startup and an indicator lamp indicating that the manufacture work machine 10 is in an operable state.

<Operation of Manufacture Work Machine>

In the present manufacture work machine 10, the above-described six work-element performing apparatuses 26, etc., perform respective operations according to the source codes stored in the auxiliary central controller 136, whereby a mounting work with respect to the circuit substrate is performed. There will be concretely explained a brief example. In an instance where a manufacture process for mounting components on a circuit substrate is described in the source codes as shown in FIG. 3, the source codes are converted into a plurality of motion commands in the auxiliary central controller 136. More specifically, as shown in FIG. 4(*a*), the source codes are converted into the following motion commands: (i) a motion command for conveying the circuit substrate into a specific position; (ii) a motion command for moving the head camera 36 to a position at which the head camera 36 can take an image of the circuit substrate; (iii) a motion command for taking an image of the circuit substrate by the head camera 36 and obtaining positional information of the circuit substrate; (iv) a motion command for moving the dispenser 32 to an application position of an adhesive on the basis of the obtained positional information; (v) a motion command for applying the adhesive to the circuit substrate; (vi) a motion command for supplying a component tray on which are placed the components to be mounted; (vii) a motion command for moving the mounter 28 to a supply position at which the components are supplied; (viii) a motion command for holding the component; (ix) a motion command for moving the mounter 28 that holds the component above the base camera 34; (x) a motion command for taking an image of the component held by the mounter 28 by the base camera 34 and obtaining information on the hold state of the component; (xi) a motion command for moving the mounter 28 to the mounting position of the component on the basis of the positional information of the circuit substrate and the information as to the hold state of the component; (xii) a motion command for separating the component; and (xiii) a motion command for conveying the circuit substrate on which the component has been mounted out of the manufacture work machine. It is noted that the motion command actually transmitted is according to a specific programming language.

The above-described plurality of motion commands are transmitted from the auxiliary central controller 136 to the main central control device 130 via the LAN cable 140, and the plurality of motion commands are sequentially transmitted by the main central control device 130 to the individual control devices 90, etc., of the respective work-element performing apparatuses 26, etc., via the respective serial communication cables 134. The motion commands from the main central control device 130 are transmitted to the individual control devices 90, etc., of all of the work-element performing apparatuses 26, etc., without particularly specifying destination device. However, as explained below, each motion command designates the work-element performing apparatus to be operated by the motion command. Therefore, the work-element performing apparatus to be operated is configured to be operated in accordance with the motion command. Hereinafter, the operations of the work-element performing apparatuses according to the respective motion commands are concretely explained.

Figure 5A:
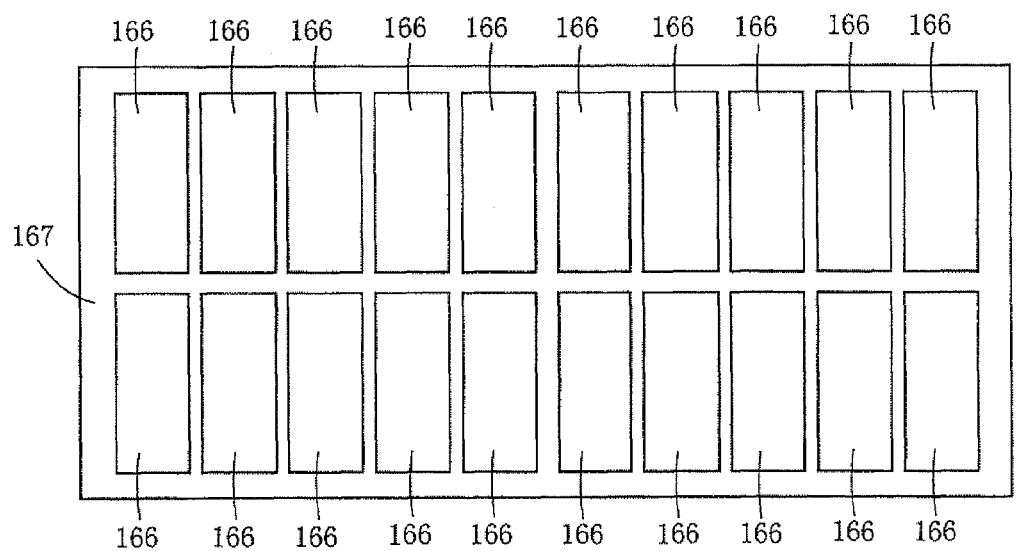
FIG. 5 is a view showing a substrate tray conveyed into the manufacture work machine of FIG. 1 and circuit substrates placed on the substrate tray.

A plurality of circuit substrates 166, each as the base member, are placed in advance on the substrate tray 167, as shown in FIG. 5(*a*). The main central control device 130 transmits a motion command for conveying the substrate tray 167 to a specific position, to the individual control device 90 via the serial communication cable 134. The motion command to be transmitted is in a format shown in the motion command No. (i) in FIG. 4(*a*). A main command in FIG. 4(*a*) is for commanding: the work-element performing apparatus which should perform one motion corresponds to the motion command: and initiation or termination of the one motion to be performed by the work-element performing apparatus. The main command in this motion command is for commanding initiation of conveyance of the substrate tray 167 by the conveyor 26. An associated command in FIG. 4(*a*) is issued as needed and is for commanding a motion parameter for the one motion to be performed by the work-element performing apparatus. More specifically, the associated command in this motion command is for commanding a conveyance amount by the conveyor 26, namely, a moving distance. As the associated command, there may be employed various parameters such as a conveyance speed, a conveyance time, and a conveyance direction. A command state in FIG. 4(*a*) indicates presence or absence of the motion command. In a state in which the motion command is being issued, the command state is set to "command issuing". In a state in which the motion command is not issued, the command state is set to "command absent". That is, in this motion command, the command state is set to "command issuing".

The conveyor control device 112 which has received the motion command from the main central control device 130 needs to control the operation of the conveyance motor 52 on the basis of the motion command. However, the motion command transmitted from the main central control device 130 is based on a certain specific programming language and is not based on a programming language that the conveyor control device 112 can handle. Therefore, the motion command transmitted from the main central control device 130 cannot cause the conveyance motor 52 to operate. The conveyor control device 112 has a function of converting the motion command from the main central control device 130 into a motion command based on a programming language compatible thereto, namely, a programming language that the conveyor control device 112 can handle. The conveyor control device 112 is configured to control the operation of the conveyance motor 52 on the basis of the motion command converted by itself. It is noted that each of the individual control devices 90, 100, 104, 108 116 of the other work-element performing apparatuses, i.e., the mounter 28, the supplier 30, the dispenser 32, the camera device 38, and the moving device 40, has a similar function and can convert the motion command from the main central control device 130 into a motion command based on a programming language compatible thereto.

When the motion of the conveyor 26 by the motion command from the main central control device 130 is terminated, namely, when the substrate tray 167 is conveyed to the specific position, a reply to the motion command is transmitted from the conveyor control device 112 to the main central control device 130 via the serial communication cable 134. The reply to be transmitted is in a format shown in FIG. 4(b). An operation result in FIG. 4(b) indicates whether or not the motion of the work-element performing apparatus by the motion command has been appropriately performed. In this reply, whether or not the substrate tray 167 has been conveyed to the specific position is indicated. The operation result in FIG. 4(b) may indicate, as needed, a parameter of the operation result such as the position to which the substrate tray 167 has been conveyed. A command state in FIG. 4(b) indicates completion of the operation of the work-element performing apparatus by the motion command. In this reply, the command state is set to "completion". When the main central control device 130 receives the reply as to termination, the command state is set to "command absent". Here, a state of the work-element performing apparatus in FIG. 4(b) indicates whether or not there is abnormality in the work-element performing apparatus. The state of the work-element performing apparatus is not utilized in the reply to the motion command, but is utilized in transmission of information that the work-element performing apparatus in an operation-difficult situation, as later explained in detail.

The main central control device 130 transmits a next motion command after it is confirmed that the substrate tray 167 has been conveyed to the specific position, namely, after the command state has been set to "command absent" by reception of the reply as to termination of the conveyance. Although a plurality of circuit substrates 166 are placed on the substrate tray 167, the following explanation will be made with respect to the motion commands for one circuit substrate 166 in the interest of brevity. The next motion command is in a format shown in the motion command No. (ii) in FIG. 4(a) and is for moving the head camera 36 to a position at which an image of the circuit substrate 166 on the substrate tray 167 can be taken. In this motion command, the main command is for commanding initiation of the movement of the head camera 36 by the moving device 40 while the associated command is for commanding a moving amount in the front-rear direction, a moving amount in the left-right direction, and a moving amount in the up-down direction. In setting the associated command, it is possible to utilize the operation result in the reply from the conveyor control device 112, more specifically, information as to the position to which the substrate tray 167 has been conveyed. When the moving-device control device 90 receives the motion command, the moving-device control device 90 converts the motion command from the main central control device 130 into a motion command based on a programming language which the moving-device control device 90 can handle, like the conveyor control device 112, and controls the operations of the respective three electromagnetic motors 58, 60, 62 on the basis of the motion command converted by itself. When the motion of the moving device 40 by the motion command is terminated, the reply to the motion command is transmitted from the moving-device control device 90 to the main central control device 130 via the serial communication cable 134.

Subsequently, the main central control device 130 transmits a next motion command after the command state has been set to "command absent" by reception of the reply as to termination of the movement of the head camera 36. More specifically, the main central control device 130 transmits the motion command (the motion command No. (iii) in FIG. 4(a)) for taking an image of the substrate by the head camera 36 and obtaining the positional information of the substrate. In this motion command, the main command is for commanding the image taking of the circuit substrate 166 by the head camera 36 and initiation of processing of the image data obtained by the image taking. When the camera-device controller 116 receives the motion command, the camera-device controller 116 converts the motion command from the main central control device 130 into a motion command in a programming language that the camera-device controller 116 can handle, like the work-element performing apparatus 112, etc. The camera-device controller 116 controls the head camera 36, the light source 80, etc., on the basis of the motion command converted by itself to take an image of the circuit substrate 166 and processes the image data obtained by the image taking, thereby obtaining the positional information of the circuit substrate 166. When the motion by the motion command is terminated, a reply to the motion command is transmitted from the camera-device controller 116 to the main central control device 130. There is attached position data of the circuit substrate 166 obtained by the image taking to the operation result in the reply from the camera-device controller 116.

After the command state has been set to "command absent" by reception of the reply as to termination of obtaining of the positional information of the circuit substrate 166, the main central control device 130 transmits the motion command (the motion command No. (iv) in FIG. 4(a)) for moving the dispenser 32 to an application position at which the adhesive is to be applied. In this motion command, the main command is for commanding initiation of the movement of the dispenser 32 by the moving device 40 while the associated command is for commanding amounts of the movement in the front-rear direction, the left-right direction, and the up-down direction, respectively. In setting the associated command, the operation result in the reply from the camera-device controller 116, more specifically, the positional information of the circuit substrate 166 is utilized. When the moving-device control device 90 receives the motion command, the moving-device control device 90 converts the motion command from the main central control device 130 into a motion command in a programming language that the moving-device control device 90 can handle and controls the operations of the respective electromagnetic motors 58, 60, 62 on the basis of the motion command converted by itself. When the motion by the motion command is terminated, a reply to the motion command is transmitted from the moving-device control device 90 to the main central control device 130.

Figure 5B:
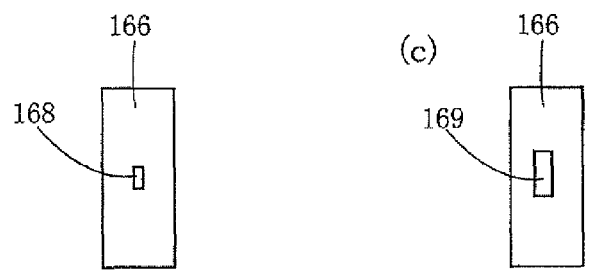

After the command state has been set to "command absent" by reception of the reply as to termination of the movement of the dispenser 32, the main central control device 130 transmits the motion command (the motion command No. (v) in FIG. 4(a)) for applying the adhesive to the circuit substrate 166. In this motion command, the main command is for commanding initiation of ejection of the adhesive by the dispenser 32 while the associated command is for commanding an ejection amount of the adhesive. As the associated command, there may be employed various motion parameters such as an ejection speed, an ejection time, an opening amount of an ejection hole through which the adhesive is ejected. When the dispenser control device 104 receives the motion command, the dispenser control device 104 converts the motion command from the main central control device 130 into a motion command according to a programming language which the dispenser control device 104 can handle and controls the operation of the ejecting device 78 on the basis of the motion command converted by itself. After the adhesive 168 is applied to the specific position on the circuit substrate 166 by the motion of the ejecting device 78 based on the motion command as shown in FIG. 5(b), a reply to the motion command is transmitted from the dispenser control device 104 to the main central control device 130.

After the command state has been set to "command absent" by reception of the reply as to termination of the application of the adhesive, the main central control device 130 transmits the motion command (the motion command No. (vi) in FIG. 4(a)) for supplying the component tray on which the components to be mounted are placed. In this motion command, the main command is for commanding supply of the component tray by the supplier 30 while the associated command is for designating the component tray on which the components to be mounted are placed. When the supplier control device 108 receives the motion command, the supplier control device 108 converts the motion command from the main central control device 130 into a motion command based on a programming language which the supplier control device 108 can handle and controls the operation of the tray moving device 54 on the basis of the motion command converted by itself. When the motion by the motion command is terminated, a reply to the motion command is transmitted from the supplier control device 108 to the main central control device 130. Here, there may be an instance in which the positional information of the component to be mounted is attached to the operation result in the reply from the supplier control device 108.

After the command state has been set to "command absent" by reception of the reply as to termination of the tray supply, the main central control device 130 transmits the motion command (the motion command No. (vii) in FIG. 4(a)) for moving the mounter 28 to a supply position at which the component is supplied. In the present manufacture work machine 10, the reply as to termination of the tray supply is transmitted after the specific component has been supplied. Where a termination time point of the tray supply is estimated, the reply as to termination of the tray supply may be transmitted prior to the termination time point. Even if the mounter 28 is moved by the moving device 40 in the midst of supplying of the component tray, the two works are not likely to mutually interfere. Accordingly, by moving the mounter 28 by the moving device 40 in the midst of supplying of the component tray, it is possible to reduce a time required for the manufacture work. An explanation of the motion of each of the work-element performing apparatuses 28, etc., by this motion command and subsequent motion commands is dispensed with for avoiding redundancy of the description. In FIG. 5(c), there is illustrated the circuit substrate 166 on which the component 169 is mounted at the position to which the adhesive has been applied.

In an instance where the work-element performing apparatus 26, etc., is in an operation-difficult situation in which the operation of the work-element performing apparatus 26, etc., is difficult due to abnormality thereof, the corresponding individual control device 90, etc., of the work-element performing apparatus 26, etc., which is in the operation-difficult situation transmits information that the work-element performing apparatus 26, etc., is in the operation-difficult situation, to the main central control device 130 via the serial communication cable 134. More specifically, data in a format shown in FIG. 4(b) is transmitted, to the main central control device 130, from the individual control device 90, etc., of the work-element performing apparatus 26 etc., which is in the operation-difficult situation. The main central control device 130 which has received the information as to the operation-difficult situation suspends transmission of the motion commands not only to the individual control device 90, etc., of the work-element performing apparatus 26, etc., which is in the operation-difficult situation, but also to the individual control devices 90, etc., of all of the work-element performing apparatuses 26, etc., so as to deal with the abnormality of the work-element performing apparatus 26, etc. The main central control device 130 is capable of grasping the abnormality of the work-element performing apparatus 26, etc., by reception of the information as to the operation-difficult situation of the work-element performing apparatus 26, etc. In view of fail-safe or the like, the individual control device 90, etc., of the work-element performing apparatus 26, etc., which is suffering from the abnormality also transmits the information of the abnormality to the main central control device 130 via the I/O cable 160.

Each of the individual control devices 90, etc., of the work-element performing apparatuses 26, etc., is configured to store information as to the operation of the corresponding work-element performing apparatus 26, etc., such as a result of performance of the motion of the work-element performing apparatus 26, etc., by the motion command, performance capabilities of the work-element performing apparatus 26, etc., for performing the motion, and a control gain of the work-element performing apparatus 26, etc. The result of performance to be stored includes the number of times in which the motion by the motion command is performed, and the number of errors of the motion by the motion command, error occurrence positions, for instance. The performance capabilities of the work-element performing apparatus 26, etc., to be stored include output capability of an electromagnetic motor where the apparatus includes the electromagnetic motor and a speed reduction ratio of a speed reducer where the apparatus includes the speed reducer, for instance. The control gain to be stored includes a control gain in determining a supply power to an electromagnetic motor where the apparatus includes the electromagnetic motor.

The information as to the operation of the work-element performing apparatus 26, etc., stored in the individual control device 90, etc., of the work-element performing apparatus 26, etc., is transmitted from the individual control device to the auxiliary central controller 136 via the LAN cable 140 and is managed in the auxiliary central controller 136. The information as to the operation of the work-element performing apparatus 26, etc., is managed in the auxiliary central controller 136, whereby the information can be backed up. Further, where the control gain of each of the electromagnetic motors 58, 60, 62 of the moving device 40 is managed in the auxiliary central controller 136, for instance, the control gain is changed and information as to the changed control gain is transmitted to the moving-device control device 90, which is helpful to change the control gain of each of the electromagnetic motors 58, 60, 62 of the moving device 40.

The individual control device 90, etc., of the work-element performing apparatus 26, etc., is incorporated in a main body of the work-element performing apparatus 26, etc., or is located in the manufacture work machine 10. Accordingly, it is rather difficult to directly access the individual control device 90, etc., for program change, program version up and so on of the individual control device 90, etc. In the present manufacture work machine 10, therefore, it is possible to transmit the changed program and so on from the auxiliary central controller 136 to the individual control device 90, etc., of the work-element performing apparatus 26, etc., via the LAN cable 140.

<Functional Structure of Each Control Device>

Figure 6:
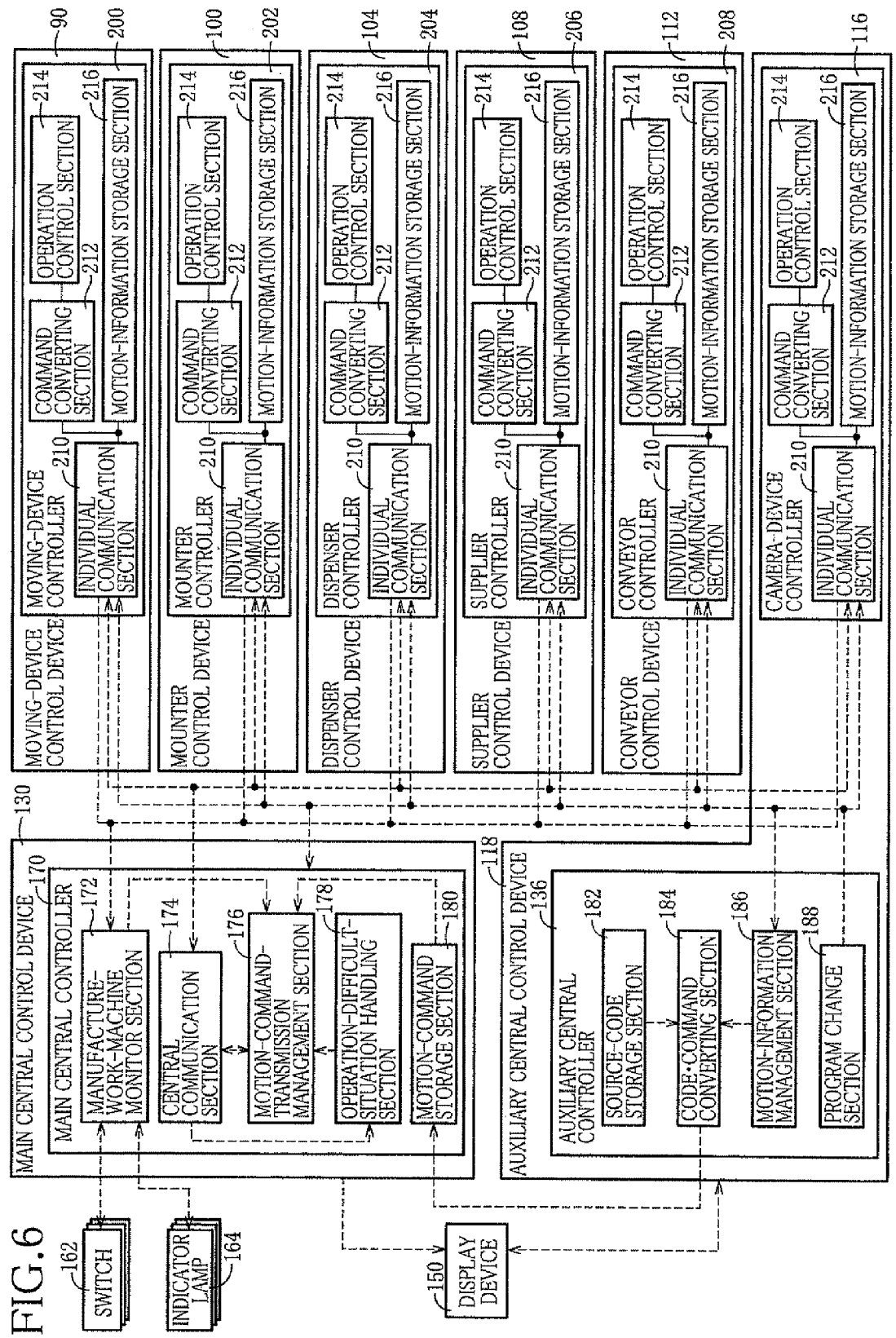
FIG. 6 is a control block diagram of the central control device and the plurality of work-element performing apparatuses of the manufacture work machine of FIG. 1.

The main central control device 130, the auxiliary central control device 118, and the individual control device 90, etc., of the work-element performing apparatus 26 etc., of the manufacture work machine 10 may be regarded to have functional structures shown in FIG. 6 in view of processing to be performed by each of the same 130, 118, 90, etc. As apparent from FIG. 6, the main central control device 130 has a main central controller 170 constituted principally by a computer equipped with a CPU, a ROM, a RAM and so on. The main central controller 170 includes: a manufacture-work-machine monitor section 172 as a functional section to monitor the operating state of the manufacture work machine 10; a central communication section 174 as a functional section to communicate with the individual control device 90, etc.; a motion-command-transmission management section 176 as a functional section to manage transmission of the motion commands; an operation-difficult-situation handling section 178 as a functional section to handle the operation-difficult situation when the work-element performing apparatuses 26, etc., is in the operation-difficult situation; and a motion-command storage section 180 as a functional section to store the plurality of motion commands.

The auxiliary central controller 136 of the auxiliary central control device 118 includes: a source-code storage section 182 as a functional section to store the source codes; a code•command converting section 184 as a functional section to convert the source codes into the plurality of motion commands; an operation-information management section 186 as a functional section to manage the information as to the operation of the work-element performing apparatus 26, etc.; and a program change section 188 as a functional section to change the program of the individual control device 90, etc., of the work-element performing apparatus 26, etc.

Each of the moving-device control device 90, the mounter control device 100, the dispenser control device 104, the supplier control device 108, and the conveyor control device 112 includes a controller constituted principally by a computer equipped with a CPU, a ROM, a RAM and so on. More specifically, the moving-device control device 90 includes a moving-device controller 200. The mounter control device 100 includes a mounter controller 202. The dispenser control device 104 includes a dispenser controller 204. The supplier control device 108 includes a supplier controller 206. The conveyor control device 112 includes a conveyor controller 208. Each of the moving-device controller 200, the mounter controller 202, the dispenser controller 204, the supplier controller 206, the conveyor controller 208, and the camera-device controller 116 includes: an individual communication section 210 as a functional section to communicate with the main central controller 170 and the auxiliary central controller 136; a command converting section 212 as a functional section to convert the motion command from the main central control device 130 into a motion command according to a programming language that the individual control device 90, etc., of itself can handle; an operation control section 214 as a functional section to control the operation of the work-element performing apparatus 26, etc., on the basis of the motion command converted by the command converting section 212; an operation-information storage section 216 as a functional section to store the information as to the operation of the work-element performing apparatus 26, etc.

The manufacture-work-machine monitor section 172 of the main central controller 170 is configured to receive transmission of information that the work-element performing apparatus 26, etc., is suffering from abnormality from the individual control device 90, etc., via the I/O cable 160 and to receive ON/OFF information of the plurality of switches 162. On the basis of the received information, the manufacture-work-machine monitor section 172 is configured to transmit various commands, the operating state of the work-element performing apparatuses 26, etc., and so on, to the motion-command-transmission management section 176. Further, the manufacture-work-machine monitor section 172 is configured to transmit an ON/OFF command to the plurality of indicator lamps 164. The central communication section 174 is configured to communicate with the individual communication section 210 of each of the individual control devices 90, etc., for communication of the motion command, the reply to the motion command, the abnormality of the work-element performing apparatus 26, etc., and so on, according to one protocol. The central communication section 174 is configured to transmit information as to abnormality of the work-element performing apparatus 26, etc., to the operation-difficult-situation handling section 178 and to transmit the reply to the motion-command-transmission management section 176.

The motion-command-transmission management section 176 is configured to sequentially transmit a plurality of motion commands stored in the motion-command storage section 180 to the individual communication section 210 via the central communication section 174. That is, the motion-command-transmission management section 176 is configured to transmit one of the plurality of motion commands and to transmit a motion command to be next transmitted subsequent to the one motion command after having received a reply to the one motion command via the central communication section 174. The operation-difficult-situation handling section 178 is configured to suspend transmission of the motion command by the motion-command-transmission management section 176 where the operation-difficult-situation handling section 178 receives information as to the abnormality of the work-element performing apparatus 26, etc., via the central communication section 174.

The code•command converting section 184 of the auxiliary central controller 136 is configured to convert the source codes stored in the source-code storage section 182 into motion commands in a specific programming language and to transmit the converted motion commands to the motion-command storage section 180 of the main central controller 170. The operation-information management section 186 is configured to receive the information as to the operation of the work-element performing apparatus 26, etc., from the operation-information storage section 216 via the individual communication section 210 and to store the information. Accordingly, the operation-information management section 186 also has a function as the central communication section. It is noted that the code•command converting section 184 can utilize the information stored in the operation-information management section 186 in converting the source codes into the motion commands. Further, the program change section 188 can receive a program from a control device different from the control device 170, etc., of the present manufacture work machine 10, storage media, and so on and can transmit the received program to the main central control device 130 and the individual control device 90, etc., of the work-element performing apparatus 26, etc., via the LAN cable 140.

The individual communication section 210 of each of the controllers 200, 202, 204, 206, 208 (hereinafter collectively referred to as "the controller 200, etc.," where appropriate) of the individual control devices 90, etc., can communicate with the central communication section 174 of the main central control device 130 for communication of the motion command, the reply to the motion command, the abnormality of the work-element performing apparatus 26, etc., according to one protocol, and also can communicate with the operation-information management section 186 for communication of the information as to the operation of the work-element performing apparatus according to the one protocol. The command converting section 212 is configured to convert the motion command received by the individual communication section 210 into a motion command in a programming language understandable for the individual control device 90, etc. of itself. The operation control section 214 is configured to control the operation of the work-element performing apparatus 26, etc., according to the motion command converted by the command converting section 212. In other words, the operation control section 214 is configured to transmit the motion command converted by the command converting section 212 to a servo amp 92, etc., or a drive circuit 102, etc., of the work-element performing apparatus 26. Further, the operation-information storage section 216 is configured to store the information as to the operation of the work-element performing apparatus 26, etc., and to transmit the stored information to the operation-information management section 186 of the auxiliary central controller 136 via the individual communication section 210, according to the one protocol.

The processing by the main central controller 170, specifically, the processing for transmitting the motion commands, more specifically, a transmission program for executing the processing for monitoring the operating state of the manufacture work machine so as to transmit the motion commands, is described in a graphic-type programming language. On the other hand, the processing by the auxiliary central controller 136, more specifically, a conversion program for executing the processing by the code•command converting section is described in a structured-type programming language. The graphic-type programming language is a programming language that is generally easier than the structured-type programming language, and is considered as a high-level programming language. That is, it is possible to comparatively easily change the transmission program. In the present manufacture work machine 10, the programming language of the transmission program is a ladder language while the programming language of the conversion program is a C language.

<Replacement of the Work-Element Performing Apparatus>

Figure 7:
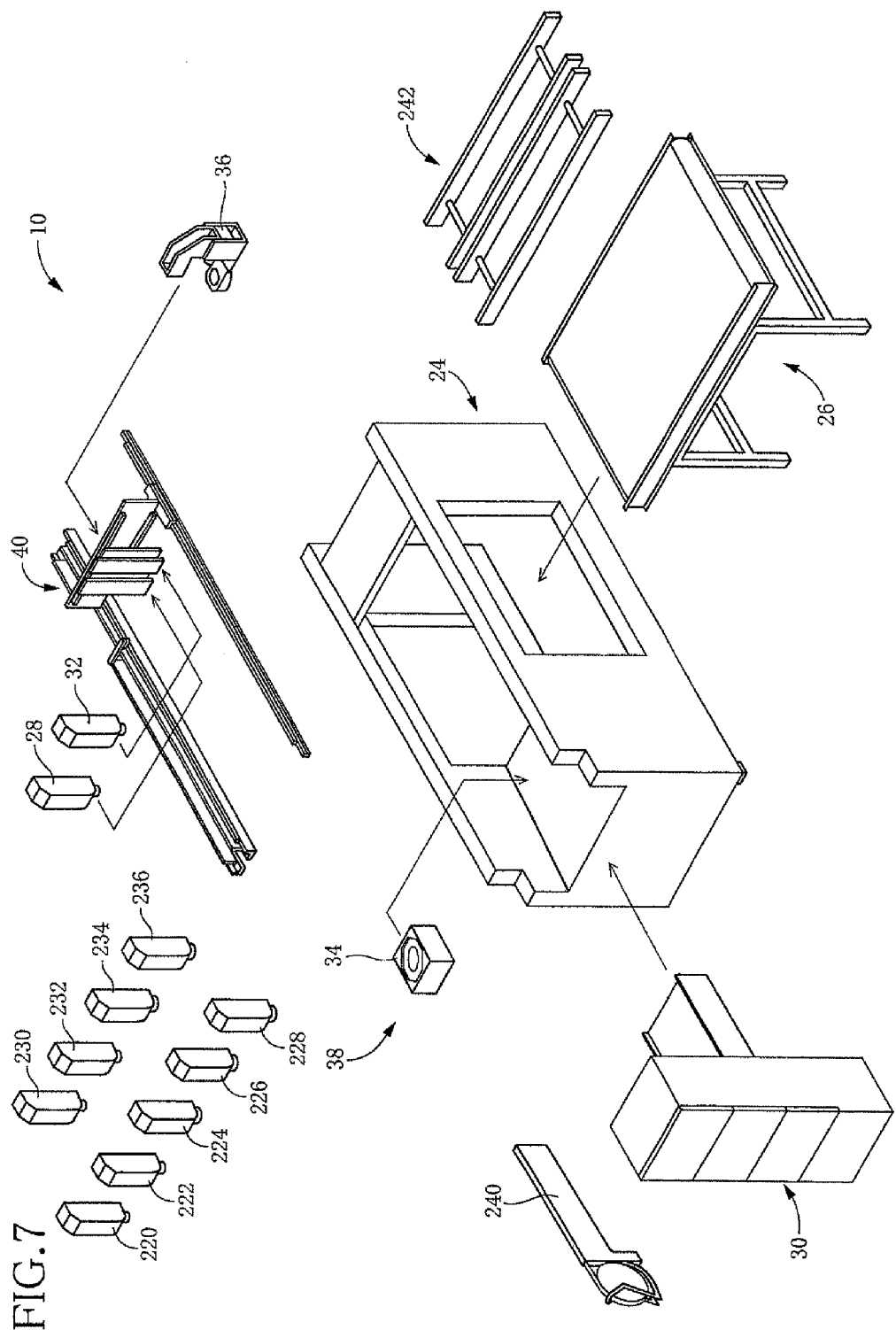
FIG. 7 is a perspective view showing a base of the manufacture work machine of FIG. 1 and the plurality of work-element performing apparatuses in a state in which the apparatuses are detached from the base.

In the present manufacture work machine 10, as shown in FIG. 7, the conveyor 26, the supplier 30, the moving device 40, and the base camera 34 of the camera device 38 are attachable to and detachable from the base 20 while the mounter 28, the dispenser 32, and the head camera 36 of the camera device 38 are attachable to and detachable from the slider 56 of the moving device 40. Some of those work-element performing apparatuses 26, etc., are attachable and detachable with one-touch action while the other of those are fixed by several bolts. All of the work-element performing apparatuses 26, etc., are constructed so as to be easily attached to and detached from the base 20 or the slider 56.

To the position at which the mounter 28 or the dispenser 32 is attached, other work-element performing apparatuses can be attached in place of the mounter 28 or the dispenser 32. More specifically, in place of the mounter 28 or the dispenser 32, the following can be attached: a high-frequency welder 220 for performing a heat treatment by a high-frequency wave on the base member; a laser generator 222 for performing laser processing on the base member; a UV irradiator 224 for performing processing by UV irradiation on the base member; a hot-air blower 226 for performing a heat treatment on the base member by applying hot air; a screw fastener 228 for performing screw fastening processing; a screw attaching/fastening device 230 for performing screw holding and separation and screw fastening processing in a state in which a screw is held; a double dispenser 232 having two dispenser nozzles and configured to perform ejection of two kinds of auxiliary agents; a mounter 234 for holding and separating another component and for performing adjustment of a component hold position; and a solder cream printer 236, for instance.

In place of the supplier 30, other kinds of suppliers, more specifically, a tape feeder 240, a ball feeder, a screw supplier, a stacking unit (not shown) and the like can be attached, for instance. In place of the conveyor 26, other kinds of conveyors, more specifically, a double conveyer 242 of a module type, a single conveyor, a conveyor with an elevating and lowering function (not shown) and the like can be attached, for instance. In place of the moving device 40, other kinds of moving devices, more specifically, a moving device of an XY-robot type (not shown) and the like can be attached, for instance. The head camera 36 and the base camera 34 can be replaced with other cameras. Accordingly, where there arises a need of manufacturing a new product and it becomes necessary to perform a work for fixing a component by a screw to a base member in place of the mounting work with respect to the circuit substrate, for instance, the manufacture work may be changed not by changing the manufacture work machine per se, but by replacing the dispenser 32 with the screw attaching/fastening device 230.

Each of the above-described plurality of work-element performing apparatuses 220-236 (hereinafter collectively referred to as the "work-element performing apparatus 220, etc., where appropriate), which can be attached in place of the six work-element performing apparatuses 26, etc., including the conveyor 26, the mounter 28 and so on that constitute the present manufacture work machine 10, has an individual control device configured to control an operation of itself, like the six work-element performing apparatuses 26, etc. Like the individual control devices 90, etc., of the work-element performing apparatuses 26, etc. that constitute the present manufacture work machine 10, the individual control device has a function of converting the motion command received by itself into a motion command in a programming language compatible thereto and is configured to control the operation of the work-element performing apparatus on the basis of the motion command converted by itself. That is, even if the work-element performing apparatus 26, etc., of the present manufacture work machine 10 is replaced with another work-element performing apparatus 220, etc., to be more specific, even if the dispenser 32 is replaced with the screw attaching/fastening device 230 as described above, the main central control device 130 may transmit the motion command according to the programming language which has been used to the individual control device of the screw attaching/fastening device 230.

To each of the plurality of work-element performing apparatuses 220, etc., which are attachable in place of the six work-element performing apparatuses 26, etc., that constitute the present manufacture work machine 10, the serial cable 134, the LAN cable 140, and the I/O cable 160 can be connected. Moreover, the individual control device of each of all work-element performing apparatuses 26, 220, etc., except the camera device 38, is incorporated in or attached to the main body which performs the work element. That is, all of the work-element performing apparatuses 26, 220, etc., except the camera device 38, is constructed to constitute a unit. Therefore, where the work-element performing apparatus is replaced, e.g., where the dispenser 32 is replaced with the screw attaching/fastening device 230, the cables 134, 140, 160 are disconnected from the dispenser 32 and connected to the screw attaching/fastening device 230, whereby replacement of the work-element performing apparatus can be completed. Here, the source codes need to be changed since the manufacture work is changed, and the source codes need to be changed as a matter of course in association with the replacement of the work-element performing apparatus.

Where the work-element performing apparatus is replaced, there is an instance in which it is desired to change the monitoring manner of the operating state of the manufacture work machine as needed. In such an instance, it may be sometimes desirable to change the transmission program. As described above, the transmission program is described in the graphic language which is comparatively easy, so that it is easily changeable. Accordingly, even where the program of the central control device needs to be changed in association with the replacement of the work-element performing apparatus, the work-element performing apparatus can be replaced without a great deal of trouble.

<Manufacture Work System constituted by a Plurality of Manufacture Work Machines>

In the single manufacture work machine 10, the number of manufacture steps that can be performed is comparatively small. However, a relatively large number of manufacture steps can be performed by constructing a manufacture work system in which the manufacture work machine which is the same as the above-described manufacture work machine 10, or the manufacture work machine in which the work-element performing apparatuses in the above-described manufacture work machine 10 are replaced, etc., is arranged in a plural number and in which the manufacture works by the plurality of manufacture work machines are sequentially performed on a base member while conveying the base member from the upstream-side manufacture work machines toward the downstream-side manufacture work machines. In other words, it is possible to manufacture products or components with a certain degree of complexity. In the present description, there will be explained the thus constructed manufacture work system, more specifically, there will be explained an LED-lamp manufacture system, a power-module manufacture system, and a solar-cell manufacture system.

i) LED-Lamp Manufacturing System

Figure 8:
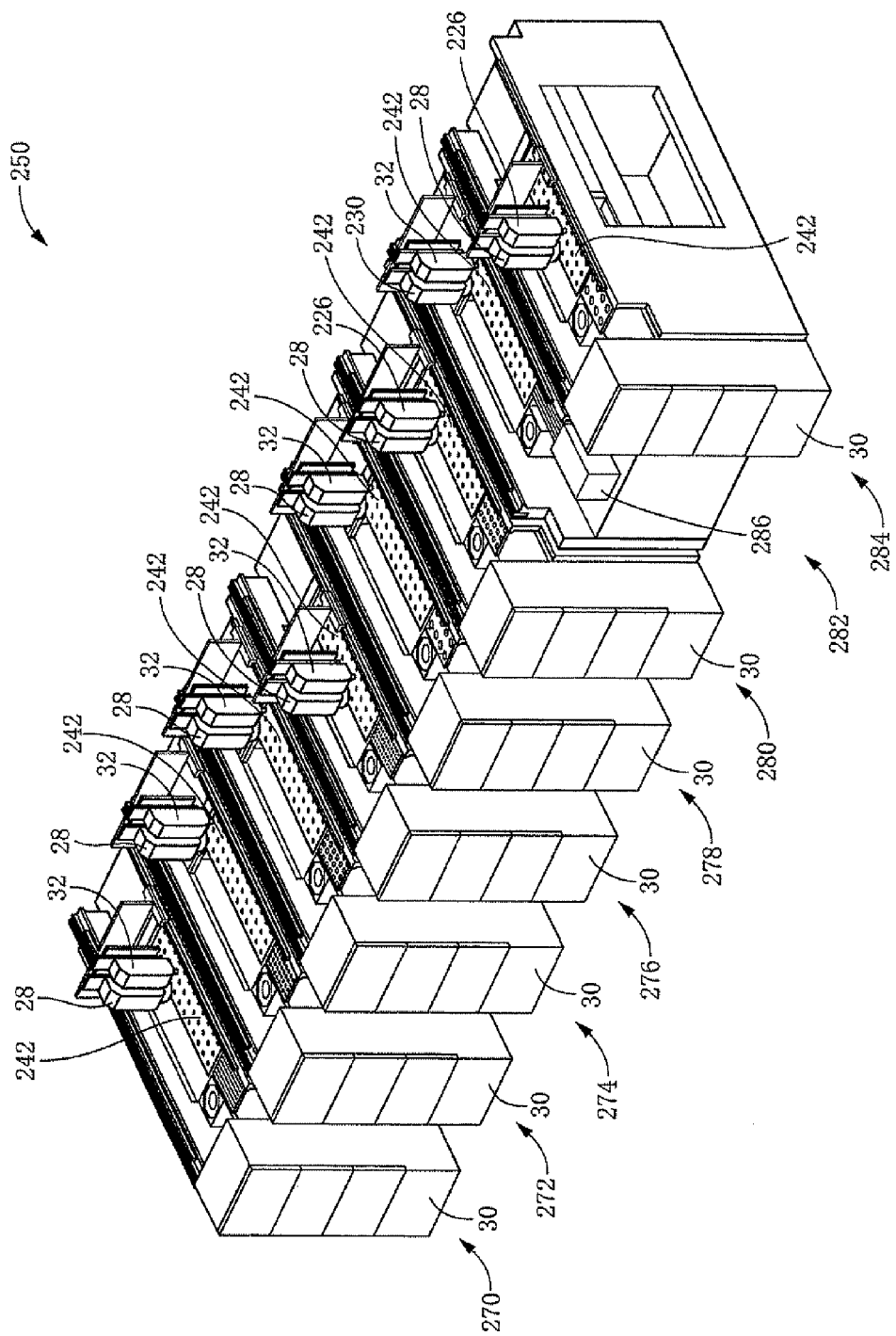
FIG. 8 is a perspective view showing an LED-lamp manufacturing system constituted by a plurality of manufacture work machines.
Figure 9:
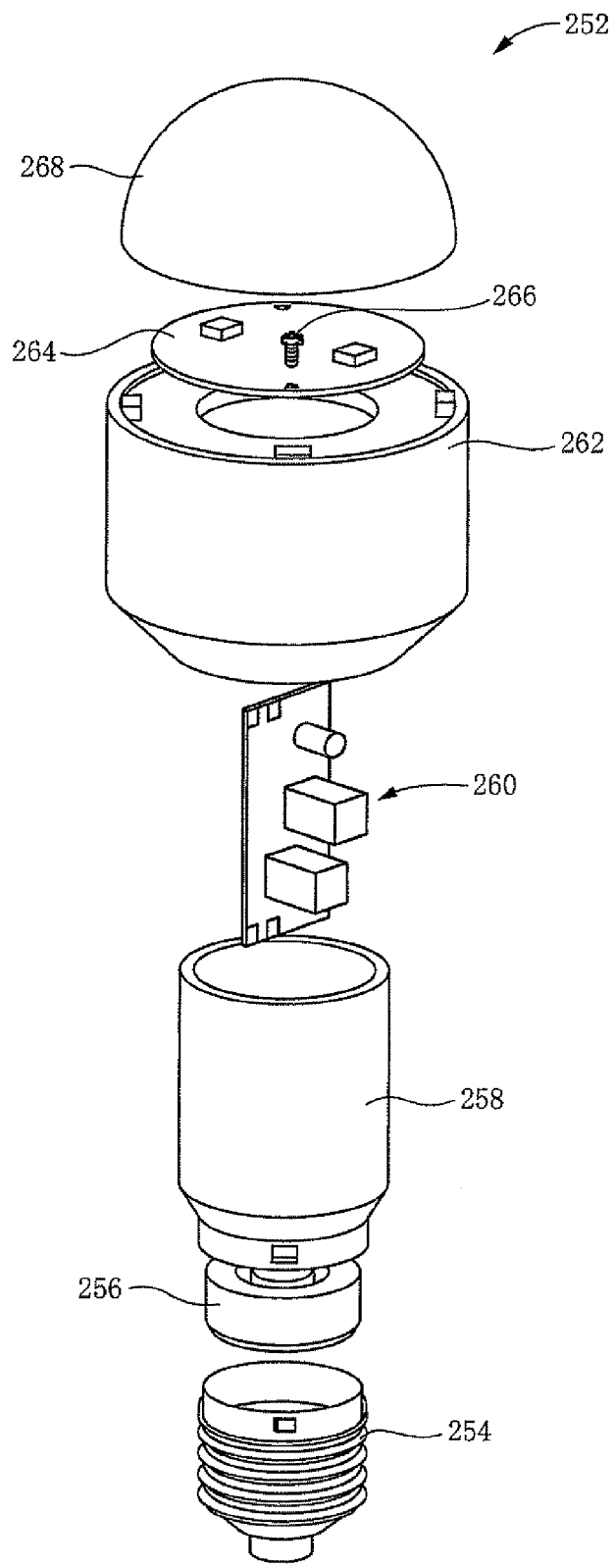
FIG. 9 is an exploded view of an LED lamp manufactured by the LED-lamp manufacturing system of FIG. 8.

FIG. 8 is a perspective view of an LED-lamp manufacturing system 250 and FIG. 9 is an exploded view of an LED lamp 252 assembled by the LED-lamp manufacturing system 250. As shown in FIG. 9, the LED lamp 252 includes: a terminal socket 254 having a cylindrical shape with a closed end; a terminal 256 provided in the terminal socket 254; a cylindrical casing 258 fitted onto an upper end of the terminal socket 254; a terminal-attached circuit board 260 provided in the casing 258; a heat sink 262 fixed to an upper end portion of the casing 258 by an adhesive; a terminal-attached LED board 264 disposed on an upper end face of the heat sink 262; a screw 266 for fixing the LED board 264 to the heat sink 262; and a semi-spherical cover 268 fixed to an upper end portion of the heat sink 262 by an adhesive.

As shown in FIG. 8, the LED-lamp manufacturing system 250 is constituted by eight manufacture work machines. The eight manufacture work machines are a first manufacture work machine 270, a second manufacture work machine 272, a third manufacture work machine 274, a fourth manufacture work machine 276, a fifth manufacture work machine 278, a sixth manufacture work machine 280, a seventh manufacture work machine 282, and an eighth manufacture work machine 284, which are arranged in this order from the upstream side (the left-hand side in FIG. 8). In each of the first manufacture work machine 270, the second manufacture work machine 272, the third manufacture work machine 274, the fourth manufacture work machine 276, and the fifth manufacture work machine 278, the double conveyer 242 of the module type is used in place of the conveyor 26 used in the above-described manufacture work machine 10. In each of the sixth manufacture work machine 280 and the eighth manufacture work machine 284, the double conveyer 242 and the hot-air blower 226 are used in place of the conveyor 26 and the dispenser 32 of the above-described manufacture work machine 10, respectively. In the seventh manufacture work machine 282, the double conveyer 242, the screw attaching/fastening device 230, and a screw supplier 286 are used in place of the conveyor 26, the mounter 28, and the supplier 30 of the above-described manufacture work machine 10, respectively.

The first manufacture work machine 270 is configured to perform a manufacture work for placing the terminal socket 254 as a base member on a specific position of the double conveyer 242. In the first manufacture work machine 270, there are sequentially transmitted: a motion command for supplying a tray on which the terminal socket 254 is placed; a motion command for moving the mounter 28 to a position at which the terminal socket 254 is supplied; a motion command for holding the terminal socket 254 placed on the tray; a motion command for moving the mounter 28 that holds the terminal socket 254 above the base camera 34; a motion command for taking, by the base camera 34, an image of the terminal socket 254 held by the mounter 28 and obtaining information of a hold state of the terminal socket 254; a motion command for moving the mounter 28 to a specific position above the double conveyer 242; a motion command for separating the terminal socket 254 at the specific position on the double conveyer 242; and a motion command for conveying the terminal socket 254 placed on the double conveyer 242. The work-element performing apparatuses 242, etc., perform their work elements in accordance with the corresponding motion commands, whereby the terminal socket 254 placed on the double conveyer 242 is conveyed to the second manufacture work machine 272. Since the motion commands to the camera device 38, the moving device 40, and the double conveyer 242 are substantially the same in each of the manufacture work machines 270, etc., an explanation of those motion commands are dispensed with.

The second manufacture work machine 272 is configured to perform a manufacture work for mounting the terminal 256 onto the terminal socket 254 as the base member. In the second manufacture work machine 272, there are sequentially transmitted: a motion command for supplying a tray on which the terminal 256 is placed: a motion command for holding the terminal 256 placed on the tray; and a motion command for separating the terminal 256 in the terminal socket 254, whereby the respective work elements are performed, so that the terminal socket 254 onto which the terminal 256 has been mounted is conveyed to the third manufacture work machine 274.

The third manufacture work machine 274 is configured to perform a manufacture work for mounting the casing 258 into the terminal socket 254 onto which the terminal 256 has been mounted. The fourth manufacture work machine 276 is configured to perform a manufacture work for mounting the circuit board 260 into the casing 258. Since the motion commands in each of the third manufacture work machine 274 and the fourth manufacture work machine 276 are similar to the motion commands in the above-described second manufacture work machine 272, an explanation thereof is dispensed with. It is noted that the dispenser 32 of each of the first manufacture work machine 270, the second manufacture work machine 272, the third manufacture work machine 274, and the fourth manufacture work machine 276 does not operate in the manufacture work of the LED lamp 252.

The fifth manufacture work machine 278 is configured to perform a manufacture work for fixing the heat sink 262 to the upper end portion of the casing 258 by the adhesive. In the fifth manufacture work machine 278, there are sequentially transmitted: a motion command for applying the adhesive to the upper end portion of the casing 258; a motion command for supplying a tray on which the heat sink 262 is placed; a motion command for holding the heat sink 262 placed on the tray; and a motion command for separating the heat sink 262 at the upper end portion of the casing 258 to which the adhesive has been applied, whereby the respective work elements are performed, so that the LED lamp 252 in which the fixing work of the heat sink 262 by the adhesive has been completed is conveyed to the sixth manufacture work machine 280.

The sixth manufacture work machine 280 is configured to perform a manufacture work for drying the adhesive applied in the fifth manufacture work machine 278 and for placing the LED board 264 onto the upper end face of the heat sink 262. In the sixth manufacture work machine 280, there are sequentially transmitted: a motion command for drying the adhesive by which the casing 258 and the heat sink 262 are bonded; a motion command for supplying a tray on which the LED board 264 is placed; a motion command for holding the LED board 264 placed on the tray; and a motion command for separating the LED board 264 onto the upper end face of the heat sink 262, whereby the respective work elements are performed, so that the LED lamp 252 in which the drying work and the placing work of the LED board 264 have been completed is conveyed to the seventh manufacture work machine 282. In the motion command for drying the adhesive, the main command is for commanding initiation of application of hot air by the hot-air blower 226 while the associated command is for commanding a blow time. As the associated command, there may be employed various parameters such as a blow temperature, a blow direction, and a blow force.

The seventh manufacture work machine 282 is configured to perform a manufacture work for fixing the LED board 264 to the heat sink 262 by the screw 266 and for applying, to the heat sink 262, the adhesive for fixing the cover 268 to be mounted in the eighth manufacture work machine 284. In the seventh manufacture work machine 282, there are sequentially transmitted: a motion command for supplying the screw 266; a motion command for holding the screw 266 supplied by the screw supplier 286; a motion command for performing screw fastening; a motion command for separating the screw 266; and a motion command for applying the adhesive to the upper end of the heat sink 262, whereby the respective work elements are performed, so that the LED lamp 252 in which the screw fastening work and the adhesive application work have been completed is conveyed to the eighth manufacture work machine 284. In the motion command for performing the screw fastening, the main command is for commanding initiation of the screw fastening while the associated command is for commanding a time of the screw fastening. As the associated command, there may be employed various parameters such as a rotation speed, a rotation torque, etc., in the screw fastening.

The eighth manufacture work machine 284 is configured to perform a manufacture work for mounting the cover 268 to the position at which the adhesive has been applied in the seventh manufacture work machine 278 and for drying the adhesive. In the eighth manufacture work machine 284, there are sequentially transmitted: a motion command for supplying a tray on which the cover 268 is placed; a motion command for holding the cover 268 placed on the tray: a motion command for separating the cover 268 onto the position on the heat sink 262 to which the adhesive has been applied; and a motion command for drying the adhesive, whereby the respective work elements are performed, so that the finished LED lamp 252 is conveyed out of the eighth manufacture work machine 284.

ii) Power-Module Manufacturing System

Figure 10:
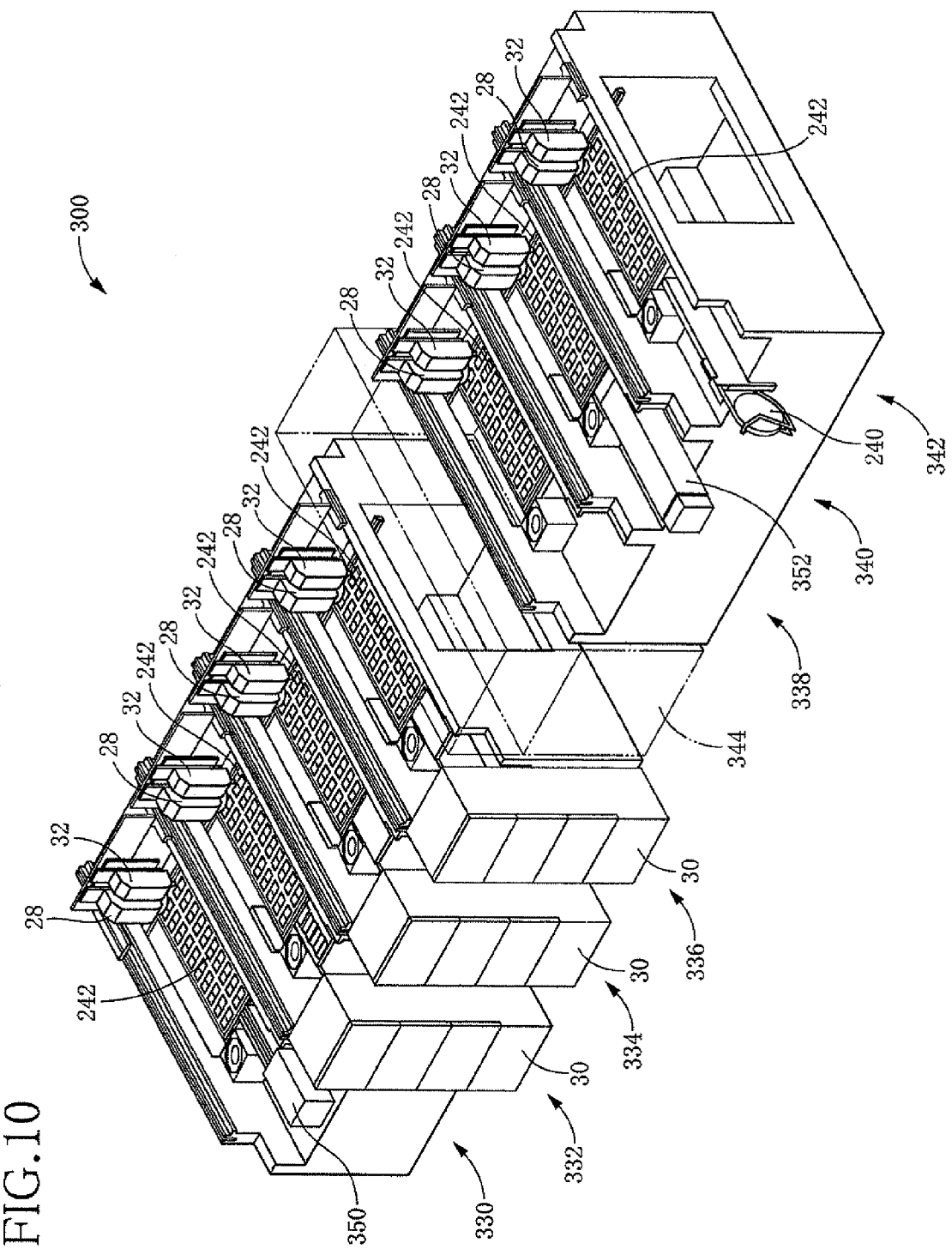
FIG. 10 is a perspective view showing a power-module manufacturing system constituted by a plurality of manufacture work machines.
Figure 11:
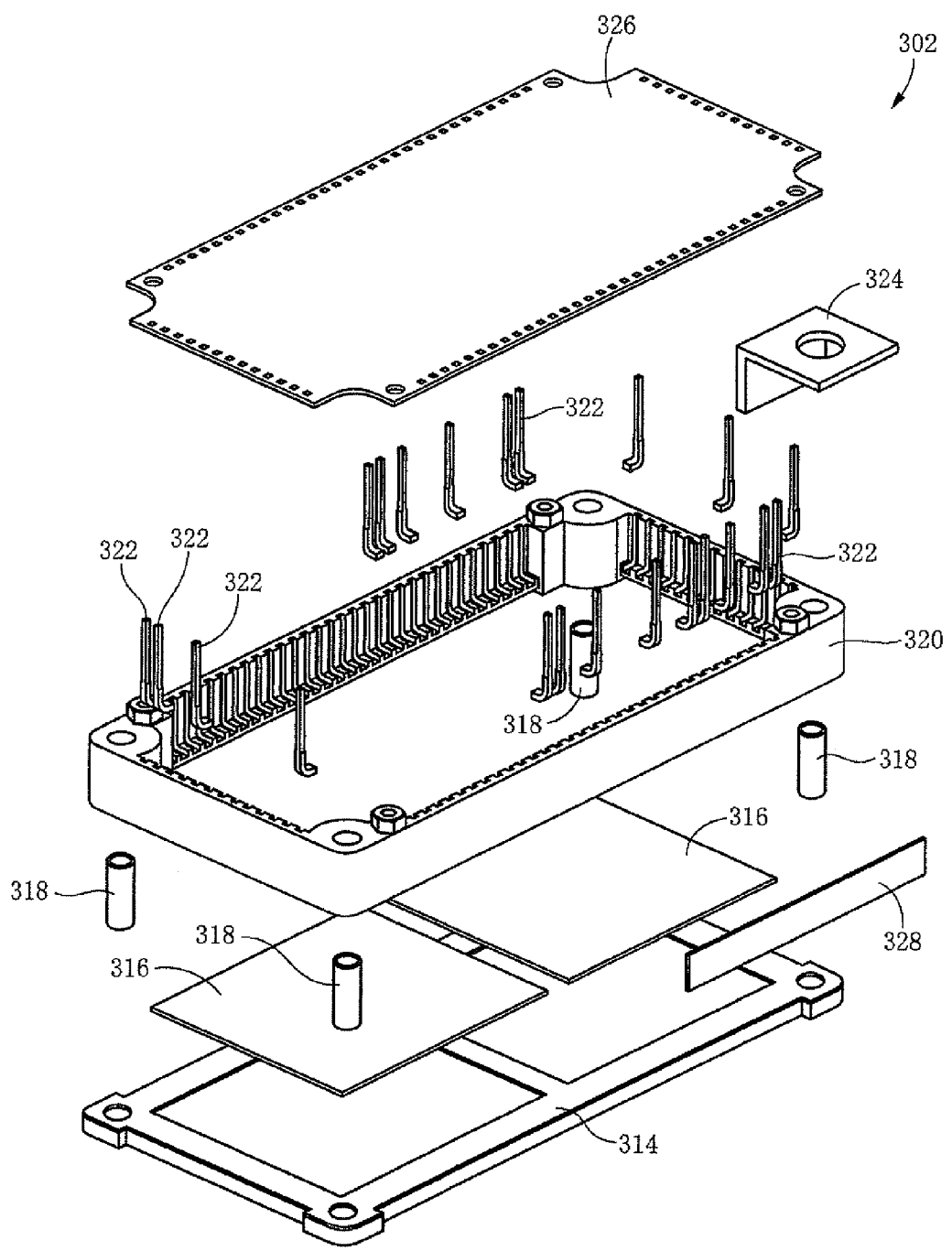
FIG. 11 is an exploded view of a power module manufactured by the power-module manufacturing system of FIG. 10.

FIG. 10 is a perspective view of a power-module manufacturing system 300. FIG. 11 is an exploded view of a power module 302 assembled by the power-module assembling system 300. As shown in FIG. 11, the power module 302 is constituted by: a base plate 314; an insulation substrate 316 soldered to the base plate 314; four bushings 318 fitted into respective four holes formed at respective four corners of the base plate 314; a casing 320 fixed onto the base plate 314 by the four bushings 318; a plurality of pin terminals 322 attached to the casing 320; a terminal 324 mounted into the casing 320; a lid 326 covering an upper portion of the casing 320; and a seal 328 attached to a side surface of the casing 320.

As shown in FIG. 10, the power-module manufacturing system 300 is constituted by seven manufacture work machines 330-342 and a wire bonding machine 344. The seven manufacture work machines 330-342 are a first manufacture work machine 330, a second manufacture work machine 332, a third manufacture work machine 334, a fourth manufacture work machine 336, a fifth manufacture work machine 338, a sixth manufacture work machine 340, and a seventh manufacture work machine 342, which are arranged in this order from the upstream side (the left-hand side in FIG. 10). The wire bonding machine 344 which is disposed between the fourth manufacture work machine 336 and the fifth manufacture work machine 338 is not relevant to the present invention and is illustrated by the long dashed double-short dashed line in FIG. 10.

In the first manufacture work machine 330, the double conveyer 242 of the module type and a bushing supplier 350 for supplying the bushings 318 are used in place of the conveyor 26 and the supplier 30 of the manufacture work machine 10, respectively. In each of the second manufacture work machine 332, the third manufacture work machine 334, and the fourth manufacture work machine 336, the double conveyer 242 is used in place of the conveyor 26 of the manufacture work machine 10. In the fifth manufacture work machine 338, the double conveyer 242 and the double dispenser 232 are used in place of the conveyor 26 and the dispenser 32 of the manufacture work machine 10, respectively, and the supplier 30 used in the manufacture work machine 10 is detached. In the sixth manufacture work machine 340, the double conveyer 242 and a lid supplier 352 for supplying the lid 326 are used in place of the conveyor 26 and the supplier 30 of the manufacture work machine 10, respectively. In the seventh manufacture work machine 342, the double conveyer 242 and the tape feeder 240 are used in place of the conveyor 26 and the supplier 30 of the manufacture work machine 10, respectively.

In the power-module manufacturing system 300, the insulation substrate 316 is soldered to the base plate 314 in advance, and the base plate 314 to which the insulation substrate 316 is attached is fed into the first manufacture work machine 330 as a base member. The first manufacture work machine 330 is configured to perform a manufacture work for mounting the four bushings 318 into the respective four corners of the base plate 314 to which the insulation substrate 316 is attached. The second manufacture work machine 332 is configured to perform a manufacture work for mounting the casing 320 onto the base plate 314 such that the four bushings 318 are fitted into the respective four holes formed at the four corners of the casing 320. The third manufacture work machine 334 is configured to perform a manufacture work for attaching the plurality of pin terminals 322 into the casing 320. The fourth manufacture work machine 336 is configured to perform a manufacture work for mounting the terminal 324 into the casing 320. When the manufacture work by the fourth manufacture work machine 336 is completed, the wire bonding machine 344 performs wire bonding processing. The power module 302 which has been subjected to the wire bonding processing is fed into the fifth manufacture work machine 338. The fifth manufacture work machine 338 is configured to perform a manufacture work for ejecting two kinds of auxiliary agents, i.e., silicone gel and epoxy resin, into the casing 320. The sixth manufacture work machine 340 is configured to perform a manufacture work for mounting the lid 326 onto the upper portion of the casing 320. The seventh manufacture work machine 342 is configured to perform a manufacture work for attaching the seal 328 to the side surface of the casing 320. When the manufacture work by the seventh manufacture work machine 342 is completed, the finished power module 302 is conveyed out of the seventh manufacture work machine 342. Since the motion commands in the manufacture work machines 330-342 of the present system 300 are similar to the motion commands in the manufacture work machines 270-284 of the above-described LED-lamp manufacturing system 250, an explanation relating to the motion commands in the present system 300 is dispensed with.

iii) Solar-Cell Manufacturing System

Figure 12:
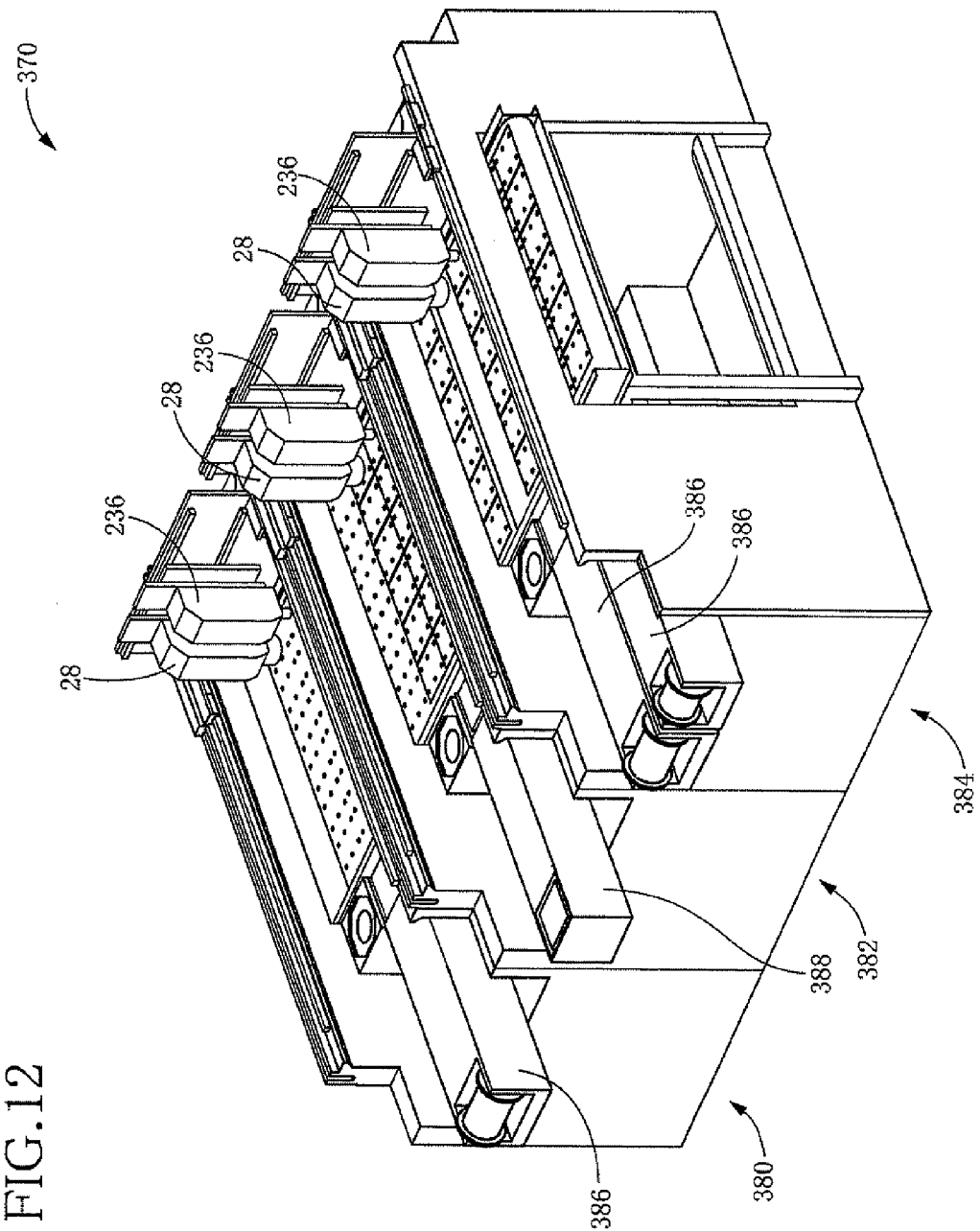
FIG. 12 is a perspective view showing a solar-cell manufacturing system constituted by a plurality of manufacture work machines.
Figure 13:
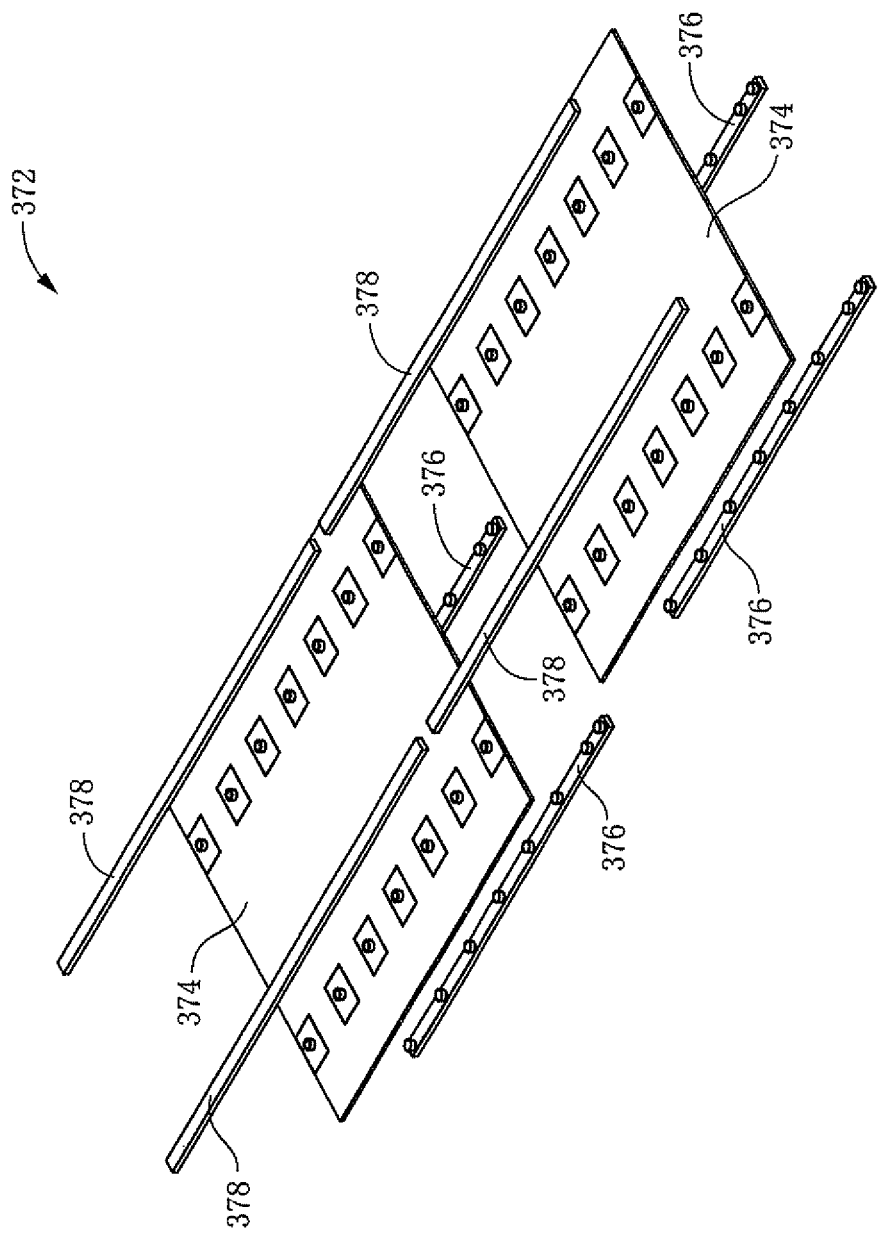
FIG. 13 is an exploded view of a solar cell manufactured by the solar-cell manufacturing system of FIG. 12.

FIG. 12 is a perspective view of a solar-cell manufacturing system 370. FIG. 13 is an exploded view of a solar cell 372 produced by the solar-cell manufacturing system 370. As shown in FIG. 13, the solar cell 372 is constituted by: a silicon cell 374; lower interconnectors 376 soldered to a lower surface of the silicon cell 374; and upper interconnectors 378 soldered to an upper surface of the silicon cell 374. The solar-cell manufacturing system 370 is constituted by three manufacture work machines, as shown in FIG. 12. The three manufacture work machines are a first manufacture work machine 380, a second manufacture work machine 382, and a third manufacture work machine 384, which are arranged in this order from the upstream side (the left-hand side in FIG. 12). In the first manufacture work machine 380, the solder cream printer 236 and an interconnector supplier 386 for supplying an interconnector are used in place of the dispenser 32 and the supplier 30 of the manufacture work machine 10, respectively. In the second manufacture work machine 382, the solder cream printer 236 and a silicon-cell supplier 388 for supplying the silicon cell 374 are used in place of the dispenser 32 and the supplier 30 of the manufacture work machine 10, respectively. In the third manufacture work machine 384, the solder cream printer 236 is used in place of the dispenser 32 of the manufacture work machine 10, and two interconnector suppliers 386 are used in place of the supplier 30 of the manufacture work machine 10.

The first manufacture work machine 380 is configured to perform a manufacture work for placing the lower interconnectors 376, each as a base member, to respective specific positions on the conveyor belt 50 of the mounter 26 and for printing solder cream on all portions on the upper surface of each lower interconnector 376 to which the solder cream should be applied. The second manufacture work machine 382 is configured to perform a manufacture work for mounting the silicon cell 374 on the lower interconnectors 376 to which the solder cream has been printed and for printing the solder cream on a part of portions of the upper surface of the silicon cell 374 on which the solder cream should be printed. The third manufacture work machine 384 is configured to perform a manufacture work for printing the solder cream on the rest of the portions of the upper surface of the silicon cell 374 on which the solder cream should be printed and for mounting the upper interconnectors 378 onto the portions on the silicon cell 374 on which the solder cream has been printed. When the manufacture work by the third manufacture work machine 384 is completed, the produced solar cell 372 is conveyed out of the third manufacture work machine 384. Since the motion commands in the manufacture work machines 380-384 in the present system 370 are similar to the motion commands in the manufacture work machines 270-284 in the above-described LED-lamp manufacturing system 250, an explanation relating to the motion commands in the present solar-cell manufacturing system 370 is dispensed with.

REFERENCE SIGNS LIST

10: manufacture work machine 24: main body (base) 26: conveyor (work-element performing apparatus) 28: mounter (work-element performing apparatus) 30: supplier (work-element performing apparatus) 32: dispenser (work-element performing apparatus) 38: camera device (work-element performing apparatus) 40: moving device (work-element performing apparatus) 90: moving-device control device (individual control device) 100: mounter control device (individual control device) 104: dispenser control device (individual control device) 108: supplier control device (individual control device) 112: conveyor control device (individual control device) 116: camera-device controller (individual control device) 130: main central control device (central control device) 134: serial communication cable (communication cable) 136: auxiliary central controller (central control device) 174: central communication section 178: operation-difficult-situation handling section 180: motion-command storage section 182: source-code storage section 184: code•command converting section 186: operation-information management section 210: individual communication section 212: command converting section 216: operation-information storage section 220: high-frequency welder (work-element performing apparatus) 222: laser generator (work-element performing apparatus) 224: UV irradiator (work-element performing apparatus) 226: hot-air blower (work-element performing apparatus) 228: screw fastener (work-element performing apparatus) 230: screw attaching/fastening device (work-element performing apparatus) 232: double dispenser (work-element performing apparatus) 234: mounter (work-element performing apparatus) 236: solder cream printer (work-element performing apparatus) 240: tape feeder (work-element performing apparatus) 242: double conveyer (work-element performing apparatus) 250: LED-lamp manufacturing system (manufacture work system) 270: first manufacture work machine 272: second manufacture work machine 274: third manufacture work machine 276: fourth manufacture work machine 278: fifth manufacture work machine 280: sixth manufacture work machine 282: seventh manufacture work machine 284: eighth manufacture work machine 286: screw supplier (work-element performing apparatus) 300: power-module manufacturing system (manufacture work system) 330: first manufacture work machine 332: second manufacture work machine 334: third manufacture work machine 336: fourth manufacture work machine 338: fifth manufacture work machine 340: sixth manufacture work machine 342: seventh manufacture work machine 350: bushing supplier (work-element performing apparatus) 352: lid supplier (work-element performing apparatus) 370: solar-cell manufacturing system (manufacture work system) 380: first manufacture work machine 382: second manufacture work machine 384: third manufacture work machine

The invention claimed is:

1. A manufacture work machine for performing, on a base member, a manufacture work that is assembling of an other component with the base member, comprising:
   a plurality of work-element performing apparatuses each of which is configured to perform one of a plurality of work elements that constitute the manufacture work, the plurality of work-element performing apparatuses including (i) a conveyor configured to perform, as one of the plurality of work elements, conveyance of the base member, (ii) a mounter configured to perform, as another one of the plurality of work elements, mounting of the other component on the base member, and (iii) a supplier configured to perform, as still another one of the plurality of work elements, supplying of the other component; and
   a central control device configured to control the plurality of work-element performing apparatuses in a centralized manner, wherein
   the central control device includes a central communication section and is configured to transmit, according to one protocol common to all of the plurality of work-element performing apparatuses, a motion command in a specific programming language, via the central communication section,
   each of the plurality of work-element performing apparatuses is controlled based on the motion command transmitted according to the one protocol and includes an individual control device configured to control an operation thereof, and the individual control device is configured to control the operation of one of the plurality of work-element performing apparatuses that is controlled by the individual control device, on the basis of a motion command transmitted from the central control device,
   the individual control device includes (a) an individual communication section configured to receive, according to the one protocol, the motion command transmitted from the central control device and (b) a command converting section configured to convert the motion command received by the individual communication section into a motion command in a programming language that the individual control device can handle, the individual control device being configured to control the one of the plurality of work-element performing apparatuses that is controlled by the individual control device, on the basis of the motion command converted by the command converting section,
   the manufacture work machine further comprises a plurality of communication cables which are provided respectively for the plurality of work-element performing apparatuses and each of which is for transmitting the motion command from the central communication section of the central control device to the individual communication section of the individual control device, and
   the plurality of communication cables are identical in kind.

2. The manufacture work machine according to claim 1, wherein the central control device is configured to transmit the motion command including (a) a main command for commanding one of initiation and termination of one motion performed by any one of the plurality of work-element performing apparatuses and (b) an associated command which is associated to the main command as needed for transmitting a motion parameter of the one motion, the motion parameter including any of a direction, an amount, a time, and a speed of the conveyance and the movement, an amount, a time, and a speed of the ejection of the auxiliary agent, and an amount, a time, and a speed of the performance of the processing and/or the treatment.

3. The manufacture work machine according to claim 1, wherein the central control device includes a motion-command storage section configured to store a plurality of motion commands necessary for performing a specific manufacture work, and
   wherein the central control device is configured to sequentially transmit the plurality of motion commands stored in the motion-command storage section to the individual control device of any of the plurality of work-element performing apparatuses.

4. The manufacture work machine according to claim 1, wherein the central control device includes: a source-code storage section configured to store source codes in which is encoded an operation of each of the plurality of work-element performing apparatuses necessary for the manufacture work machine to perform a specific manufacture work; and a code command converting section configured to convert the source codes stored in the source-code storage section into motion commands, and
   wherein the central control device is configured to transmit the motion commands converted by the code command converting section.

5. The manufacture work machine according to claim 4,
wherein the code command converting section is configured to convert the source codes stored in the source-code storage section into the motion commands by execution of a conversion program, and
wherein a programming language of the conversion program is different from a programming language of a transmission program for processing in which the central control device transmits the motion command.

6. The manufacture work machine according to claim 5, wherein the programming language of the transmission program is a higher-level programming language than the programming language of the conversion program.

7. The manufacture work machine according to claim 5, wherein the programming language of the conversion program is a structured-type programming language.

8. The manufacture work machine according to claim 5, wherein the programming language of the transmission program is a graphic-type programming language.

9. The manufacture work machine according to claim 5, wherein the programming language of the transmission program is a ladder language.

10. The manufacture work machine according to claim 1, wherein the individual control device is configured to transmit, according to the one protocol, a reply as to termination of one motion which is being performed by one of the plurality of work-element performing apparatuses that is controlled by the individual control device on the basis of one motion command, to the central control device via the individual communication section.

11. The manufacture work machine according to claim 10, wherein the individual control device is configured to transmit, to the central control device, the reply as to termination of the one motion at a termination time point when the one motion is actually terminated.

12. The manufacture work machine according to claim 10, wherein the individual control device is configured to transmit, to the central control device, the reply as to termination of the one motion prior to a termination time point, where the termination time point is estimated.

13. The manufacture work machine according to claim 10, wherein the central communication section is configured to receive, according to the one protocol, the reply as to termination of the one motion.

14. The manufacture work machine according to claim 10, wherein the central control device is configured to transmit a next motion command that is to be transmitted subsequent to the one motion command after having received the reply as to termination of the one motion.

15. The manufacture work machine according to claim 1, wherein the individual control device is configured to transmit, according to the one protocol, information that one of the plurality of work-element performing apparatuses that is controlled by the individual control device is in an operation-difficult situation in which an operation of the one of the plurality of work-element performing apparatuses is difficult, to the central control device via the individual communication section.

16. The manufacture work machine according to claim 15, wherein the central communication section is configured to receive, according to the one protocol, the information that the one of the plurality of work-element performing apparatuses is in the operation-difficult situation.

17. The manufacture work machine according to claim 15, wherein the central control device includes an operation-difficult-situation handling section configured to handle the operation-difficult situation where the central control device receives the information that the one of the plurality of work-element performing apparatuses is in the operation-difficult situation.

18. The manufacture work machine according to claim 17, wherein the operation-difficult-situation handling section is configured to suspend transmission of the motion command to the individual control device of the one of the plurality of work-element performing apparatuses where the central control device receives the information that the one of the plurality of work-element performing apparatuses is in the operation-difficult situation.

19. The manufacture work machine according to claim 1, wherein the individual control device includes an operation-information storage section configured to store information as to an operation of one of the plurality of work-element performing apparatuses that is controlled by the individual control device.

20. The manufacture work machine according to claim 19,
wherein the individual control device is configured to transmit, according to the one protocol, the information as to the operation stored in the operation-information storage section to the central control device via the individual communication section, and
wherein the central control device includes an operation-information management section configured to manage the information as to the operation transmitted thereto.

21. The manufacture work machine according to claim 20, the central communication section is configured to receive, according to the one protocol, the information as to the operation stored in the operation-information storage section.

22. The manufacture work machine according to claim 1,
wherein each of the plurality of work-element performing apparatuses includes a main body configured to actually operate for performing one of the plurality of work elements, and
wherein, in at least one of the plurality work-element performing apparatuses, the individual control device is fixed to a part of the main body, so that the at least one of the plurality work-element performing apparatuses constitutes a unit.

23. The manufacture work machine according to claim 1, further comprising a base,
wherein each of the plurality of work-element performing apparatuses is configured to be attachable to and detachable from one of the base and another of the plurality of work-element performing apparatuses.

24. The manufacture work machine comprising a plurality of manufacture work machines according to claim 1 arranged so that manufacture works by the respective plurality of manufacture work machines are sequentially performed on a base member as a work target while the base member is conveyed from an upstream one of the plurality of manufacture work machines toward a downstream one of the plurality of manufacture work machines.

* * * * *